United States Patent
Keränen et al.

(10) Patent No.: US 11,166,363 B2
(45) Date of Patent: Nov. 2, 2021

(54) ELECTRICAL NODE, METHOD FOR MANUFACTURING ELECTRICAL NODE AND MULTILAYER STRUCTURE COMPRISING ELECTRICAL NODE

(71) Applicant: TACTOTEK OY, Oulunsalo (FI)

(72) Inventors: Antti Keränen, Oulunsalo (FI); Tomi Simula, Oulunsalo (FI); Mikko Heikkinen, Oulunsalo (FI); Jarmo Sääski, Oulunsalo (FI); Pasi Raappana, Oulunsalo (FI); Minna Pirkonen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/245,643

(22) Filed: Jan. 11, 2019

(65) Prior Publication Data

US 2020/0229295 A1    Jul. 16, 2020

(51) Int. Cl.
*H05K 1/02* (2006.01)
*H05K 1/18* (2006.01)
(Continued)

(52) U.S. Cl.
CPC ........... *H05K 1/0204* (2013.01); *H05K 1/181* (2013.01); *H05K 3/284* (2013.01); *H05K 5/065* (2013.01);
(Continued)

(58) Field of Classification Search
CPC ... H05K 1/11; H05K 1/16; H05K 9/00; H05K 9/02; H05K 5/03; H05K 1/02; H05K 1/04;
(Continued)

(56) References Cited

U.S. PATENT DOCUMENTS 4,092,487 A * 5/1978 Imai ................. H05K 3/284
                                                  174/524
4,216,577 A * 8/1980 Badet ............... G06K 19/07718
                                                  156/219
(Continued)

FOREIGN PATENT DOCUMENTS

DE    102014210523 A1    12/2015

OTHER PUBLICATIONS

International Search Report issued by the European Patent Office acting as the International Searching Authority in relation to International Application No. PCT/FI2020/050019 dated Apr. 29, 2020 (5 pages).

(Continued)

*Primary Examiner* — Tuan T Dinh
(74) *Attorney, Agent, or Firm* — Robert P. Michal, Esq.; Carter, DeLuca & Farrell LLP

(57) ABSTRACT

An electrical node includes a substrate for accommodating a functional element. The substrate includes a first side and an opposite second side, and hosting a number of connecting elements. The functional element includes an electronic component and conductive traces. The electrical node also includes a first material layer defining a protective covering. The first material layer defining at least a portion of the exterior surface of the nod arranged to reduce at least thermal expansion and/or mechanical deformation related stresses between one or more elements included in the node, adjacent the node and/or at least at a proximity thereto.

22 Claims, 9 Drawing Sheets

(51) Int. Cl.
  *H05K 5/06* (2006.01)
  *H05K 3/28* (2006.01)
(52) U.S. Cl.
  CPC . *H05K 2201/066* (2013.01); *H05K 2201/068* (2013.01); *H05K 2201/10522* (2013.01); *H05K 2203/1316* (2013.01); *H05K 2203/1322* (2013.01); *H05K 2203/1327* (2013.01)
(58) Field of Classification Search
  CPC .......... H05K 1/0204; H05K 2201/1066–1068; H05K 2201/0133; H05K 2201/10106; H05K 2201/10151; H01L 23/00; H01L 23/02; H01L 23/06; H01L 23/14; G06K 19/07; G06K 19/077; G06K 19/0778
  USPC ......... 361/736–752, 816, 818; 174/250–262, 174/350–355; 257/787–790
  See application file for complete search history.

(56) References Cited

U.S. PATENT DOCUMENTS

| | | | |
|---|---|---|---|
| 5,498,388 A * | 3/1996 | Kodai | B29C 45/14647 264/263 |
| 5,994,773 A * | 11/1999 | Hirakawa | H01L 21/486 257/668 |
| 6,214,525 B1 | 4/2001 | Boyko et al. | |
| 6,241,153 B1 * | 6/2001 | Tiffany, III | B29C 45/14647 235/488 |
| 6,431,456 B2 * | 8/2002 | Nishizawa | G06K 19/07 235/380 |
| 6,433,285 B2 * | 8/2002 | Maeda | G06K 19/072 174/255 |
| 6,577,004 B1 * | 6/2003 | Rumsey | H01L 23/3114 174/250 |
| 6,607,135 B1 * | 8/2003 | Hirai | G06K 19/07718 235/487 |
| 6,713,845 B2 | 3/2004 | Hayashi et al. | |
| 6,713,849 B2 * | 3/2004 | Hasebe | H01L 23/3107 257/667 |
| 6,854,984 B1 * | 2/2005 | Lee | G06K 19/07732 439/607.41 |
| 6,910,637 B2 | 6/2005 | Hsieh et al. | |
| 6,970,360 B2 * | 11/2005 | Sinha | G06F 21/86 174/541 |
| 6,985,363 B2 * | 1/2006 | Yagi | G06K 19/07 361/760 |
| 6,988,668 B2 * | 1/2006 | Osako | B29C 45/14655 235/492 |
| 7,151,674 B2 * | 12/2006 | Sasaki | B60R 16/0239 361/752 |
| 7,359,204 B1 * | 4/2008 | Jang | G06K 19/07 235/492 |
| 7,374,104 B2 * | 5/2008 | Aoki | G06K 19/07732 235/492 |
| 7,375,975 B1 * | 5/2008 | Jang | G06K 19/07728 235/492 |
| 7,629,679 B2 * | 12/2009 | Park | G06K 19/07724 257/679 |
| 7,768,139 B2 * | 8/2010 | Knapp | H01L 23/293 257/787 |
| 7,872,483 B2 * | 1/2011 | Han | H01L 23/538 324/757.02 |
| 8,705,238 B2 * | 4/2014 | Nakashiba | G11C 5/005 361/715 |
| 10,347,554 B2 | 7/2019 | Santos et al. | |
| 2005/0095410 A1 | 5/2005 | Mazurkiewicz | |
| 2006/0012034 A1 | 1/2006 | Kadoya et al. | |
| 2006/0158804 A1 * | 7/2006 | Usui | H01L 21/568 361/58 |
| 2006/0220204 A1 * | 10/2006 | Wada | G06K 19/077 257/679 |
| 2007/0090473 A1 * | 4/2007 | Engling | B81B 7/0058 257/414 |
| 2007/0206365 A1 * | 9/2007 | Shiu | H05K 3/284 361/752 |
| 2008/0170372 A1 | 7/2008 | Kirigaya | |
| 2009/0086455 A1 * | 4/2009 | Sakamoto | H05K 1/144 361/796 |
| 2012/0057309 A1 * | 3/2012 | Yu | G06K 19/07 361/730 |
| 2014/0268580 A1 | 9/2014 | Mass et al. | |
| 2014/0362535 A1 | 12/2014 | Meier et al. | |
| 2015/0076517 A1 * | 3/2015 | Terai | H01L 29/1608 257/77 |
| 2015/0282341 A1 * | 10/2015 | Hu | H05K 1/0393 361/750 |
| 2015/0366063 A1 | 12/2015 | Takagi et al. | |
| 2016/0290878 A1 | 10/2016 | Severinkangas et al. | |
| 2017/0082167 A1 | 3/2017 | Donzelli et al. | |
| 2017/0135198 A1 | 5/2017 | Keranen et al. | |
| 2017/0321094 A1 * | 11/2017 | Holtgrewe | C08L 63/00 |
| 2018/0220534 A1 | 8/2018 | Heikkinen et al. | |
| 2018/0359860 A1 | 12/2018 | Heikkinen et al. | |

OTHER PUBLICATIONS

Written Opinion of the International Searching Authority issued by the European Patent Office acting as the International Searching Authority in relation to International Application No. PCT/FI2020/050019 dated Apr. 29, 2020 (6 pages).
Office Action issued by the United States Patent and Trademark Office in relation to U.S. Appl. No. 16/833,744 dated May 6, 2020 (43 pages).
Office Action issued by the United States Patent and Trademark Office in relation to U.S. Appl. No. 16/833,744 dated Aug. 21, 2020 (12 pages).
Office Action issued by the United States Patent and Trademark Office, in relation to U.S. Appl. No. 16/833,744, dated Oct. 20, 2020, 19 pages.
Written Opinion of the International Preliminary Examining Authority issued by the European Patent Office acting as the International Preliminary Examining Authority in relation to International Application No. PCT/FI2020/050019 dated Jan. 25, 2021 (7 pages).
Final Office Action issued by the United States Patent and Trademark Office, in relation to U.S. Appl. No. 16/833,744, dated Feb. 23, 2021, 15 pages.
Final Office Action issued by the United States Patent and Trademark Office, in relation to U.S. Appl. No. 16/833,744, dated Feb. 16, 2021, 18 pages.
Non-Final Office Action issued by the U.S. Patent and Trademark Office in relation to U.S. Appl. No. 16/833,744, dated Jun. 2, 2021, 14 pages.
International Preliminary Report on Patentability issued by the European Patent Office acting as the International Preliminary Examining Authority in relation to International Application No. PCT/FI2020/050019 dated Apr. 19, 2021 (9 pages).
Notice of Allowance issued by the United States Patent and Trademark Office, in co-pending U.S. Appl. No. 16/833,744, dated Sep. 3, 2021, 13 pages.

* cited by examiner

300

400

ELECTRICAL NODE, METHOD FOR MANUFACTURING ELECTRICAL NODE AND MULTILAYER STRUCTURE COMPRISING ELECTRICAL NODE

FIELD OF THE INVENTION

The present invention relates in general to functional, integrated assemblies such as electronic assemblies. In particular, however not exclusively, the present invention concerns electrical nodes for implementing functionality or functionalities in such assemblies including e.g. a molded, optionally injection molded, material layer.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material.

However, in the known solutions, the implementation of complex functionalities may face reliability risks and assembly yield related issues arising from challenges in integrating very dense components and components with complex geometries. Furthermore, the electronic assembly may require, for example, the use of external control electronics which reduces degree of integration and makes the structures less attractive. Directly integrating a possibly large number of dense components and components of complex geometry onto a potentially considerable larger substrate can be challenging and potentially very risky, as reliability will often be affected by molding pressure, for instance, and the assembly yields in different production phases can be very low. Subassemblies mounted or arranged on a PCB and covered with a plastic layer can suffer from mismatch e.g. in terms of thermal expansion, be difficult to be overmolded due to their complex structure, and exhibit stresses in the structure which can tear the subassemblies off their electrical contacts. Challenges in thermal management may also generally cause issues such as overheating.

Accordingly, both direct provision of functional or specifically electrical elements such as related components on a larger host substrate and preparation of collective subassemblies upfront for subsequent mounting thereon have their own downsides in terms of electronics vulnerability, structural and installation complexity as well as thermal management, for example, whereupon there remains room for improvement in terms of related improved or alternative manufacturing techniques and resulting end structures. There is thus still need to develop structures and methods related both to IMSE technology and integrated electronics in general.

SUMMARY

The objective of the present invention is to at least alleviate one or more of the above drawbacks associated with the known solutions in the context of integral structures including functional elements such as electronics and utilizing molded or cast material layers or structures.

The objective is achieved with various embodiments of a functional, preferably at least electrical, in terms of e.g. intended use (e.g. use context such as IMSE), included elements and/or related connectivity, node, a related multilayer structure incorporating a number of such nodes, and a method of manufacture.

According to a first aspect, a preferably electrically functional node is thereby provided. The functional node, which may be realized e.g. as mountable integral (electronic) component, preferably comprises:

a substrate for accommodating at least one, optionally printed and/or mounted, functional element such as electrical element, the substrate having a first side and an opposite second side, the substrate further hosting a number of connecting elements, optionally including contact pads or pins, for functionally, preferably electrically or electromagnetically, such as inductively, capacitively, and/or optically, connecting the at least one functional element with a circuit or other element of an external, optionally host, structure;

the at least one functional element, preferably comprising at least one electronic component and/or a number of conductive traces connecting thereto, provided to and optionally projecting from the first side of the substrate; and a first material layer (preferably solidified from a flowing material or generally pre-solidified state) defining a protective covering at least upon the at least one functional element, optionally essentially embedding the projected portion of said at least one functional element therewithin, if any, and preferably further upon at least a portion of the first side of the substrate surrounding the at least one functional element;

wherein the first material layer comprises elastic material arranged to reduce at least thermal expansion and/or mechanical deformation related stresses between one or more elements included in the node, adjacent the node and/or at least at a proximity thereto, preferably between the connecting elements and at least one element of the external structure, such as a plastic or other material layer (e.g. wood or other organic/biomaterial, fabric/textile, metal) molded, cast or otherwise produced or provided over the node.

In various embodiments, instead of or in addition to providing a functional such as an electrical element upon the substrate such that it substantially projects from the first side of the substrate, a functional element may be provided in a recess or hole, optionally through-hole established in the substrate. Accordingly, the element may be accommodated by the recess or hole of the substrate e.g. in such a manner that it (and optionally the first material layer thereon) does not protrude at all or at least considerably from the substrate. At least the extent of protrusion may be reduced e.g. in favor of reduced thickness of the concerned node in general. The element may, in any case, be located at the recess bottom defined by the substrate material, if any, so that it extends therefrom towards the first side of the substrate. A smaller recess may still remain at the location of the element, if the original one is only partially filled by the element and e.g. the covering first material layer. The substrate could thus be provided with a substantially flush first (and/or second) surface by embedding functional element(s) therein.

In various preferred embodiments, the functional element comprises at least one electrical, optionally specifically electronic, component and/or a number of electrical conductors such as traces, or 'wiring', connecting thereto. Yet, the functional element may include e.g. a sub-assembly with an own substrate ("sub-substrate") and elements such as electrical or specifically electronic components hosted by the (sub-)substrate.

Various embodiments of functional and especially electrically functional) elements are also listed hereinafter.

In various embodiments, the first material layer may define at least portion of the exterior surface of the node. However, as being appreciated by a person skilled in the art, the first material layer may be covered, at least in places, i.e. selectively, by further material(s) such as a selected coating or film layer, or especially upon installation in a host structure, e.g. on a host substrate, by optionally thicker material layer that may be molded or cast, for instance, over the node.

A substrate utilized in the node or in a related host structure may refer to a rigid or flexible substrate in which one (e.g. z, such as "thickness") of the three dimensions is significantly shorter with respect to the other two (e.g. x and y) dimensions, for example. The substrate may, at least originally, be essentially planar or planar-like substrate, such as a substrate sheet or film. Yet, the substrate may at least locally, if not generally, contain or define essentially three-dimensional shapes such as a protrusion or recess, curved portion, angular portion, etc., which may be due to 3D-forming such as thermoforming or cold forming of the substrate (film) depending on the substrate material and related compatible 3D shaping methods. The substrate may indeed be of film type and/or contain e.g. thermoformable and/or thermoplastic material. Typically, the substrate is made of or provided with electrically insulating material.

In various embodiments, the hardness of at least one material of the first material layer is preferably about 85 or less on Shore scale A or about 40 or less on Shore scale D.

In various embodiments, the modulus of elasticity of at least one material of the first material layer is preferably about 2000 MPA or less, more preferably about 500 MPA or less, and most preferably about 100 MPA or less.

Accordingly, relatively soft material (low(er) hardness and/or low(er) modulus of elasticity) could be applied as at least one component of the first material layer (e.g. base or filler) if not constituting it substantially fully.

In various embodiments, the first material layer is adherent to a preferably flowable/flowing and further preferably thereafter solidified, preferably plastic, material that is subsequently provided in contact with the first material layer and optionally selected from the group consisting of: thermoplastic material, polymeric or alike material, lignin or alike material, TPU, polymer, elastomeric material, PC, PMMA, ABS, PET, PA (polyamide), GPPS, PCPA (pentachlorophenyl acrylate), cellulose based thermoplastic material, and MS resin. The plastic material may be molded or cast, for instance, upon the first material layer and the node in general.

In various embodiments the first material layer is adherent to material that is subsequently provided in contact with the first material layer and optionally selected from the group consisting of: metal, wood, solid wood, veneer, plywood, bark, tree bark, birch bark, cork, leather, fabric or textile, natural leather, natural textile or fabric material, textile material, cotton, wool, linen, silk, formable material, thermoformable material, cold-formable material, epoxy, multi-component epoxy, ink, and conductive ink.

In various embodiments, the first material layer is selected and/or processed so as to be adherent to a material of the substrate and/or of said at least one functional or specifically, electrical element, the concerned material preferably comprising at least one material selected from the group consisting of: polymer, conductive polymer, thermoplastic material, organic material, elastomeric material, electrically insulating material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), metal, wood, solid wood, veneer, plywood, bark, tree bark, birch bark, cork, (natural) leather, (natural) textile or fabric material, textile material, cotton, wool, linen, silk, formable material, thermoformable material, cold-formable material, gold, copper, tin, silver, palladium, solder resist, thermally curable solder resist, UV curable solder resist, epoxy, lignin or alike material, cellulose based material, multi-component epoxy, ink, and conductive ink.

In various embodiments, the first material layer comprises or consists of material associated with a coefficient of thermal expansion (CTE) falling in a range between about 1 and 300 ppm/K, more preferably between about 10 and 200 ppm/K, and most preferably between about 25 and 80 ppm/K.

Thermal expansion characteristics such as coefficients of certain materials may vary considerably depending on the temperature, which shall be acknowledged by a person skilled in the art while considering the applicability of various materials in terms of such characteristics and in the light of probable temperatures the concerned material is eventually subjected to when the associated node is in use or storage, for example. Similar considerations apply to material elasticity.

In various embodiments, the first material layer comprises composite material and/or a number of fillers in a host material, the first material layer optionally comprising or consisting of multiple sub-layers, and/or said first material layer comprises mutually different constitutions of material, preferably organized in sub-layers, having characterizing functional properties such as refractive indexes or other optical characteristics to establish a selected optical functionality.

In various embodiments, the first material comprises or essentially consists of thermally conductive material, said thermally conductive material being optionally provided in the form of one or more fillers. A filler material could be mixed, e.g. as particles, with other, potentially dominant material(s) of the first material.

In various embodiments, the first material layer comprises or essentially consists of optically, having regard to selected wavelengths optionally including visible light, essentially transparent and/or colorless material that is substantially preferably chemically inert to discoloration when exposed to heat or high-energy photons. The material(s) of the first material layer may additionally or alternatively have various other desired characteristics, either locally or generally, in terms of e.g. electrical conductivity (conductive/insulating, whereupon desired electrically conductive features such as conductors or shields for e.g. the embedded electronics, or insulating features could be implemented therefrom, considering e.g. metal materials such as silver or copper).

Yet, in some embodiments the material of the first material layer could be used for photon down- or upconversion. The material could be at least locally luminescent. It could be then applied as a scintillator excited by radiation, for example. Accordingly, e.g. a radiation detector could be manufactured. Still, the first material layer could be configured and used for dissipation or amplification of electromagnetic field, thermal conduction or insulation, and/or light diffusion (or alternative light control) among other options.

The first material layer may comprise e.g. base (host) material and filler(s) to achieve the desired functionalities. In various embodiments, the substrate comprises at least one element selected from the group consisting of: planar piece of substrate material, printed circuit board, rigid printed circuit board, flexible printed circuit board, FR4 based circuit board, ceramic electrical substrate (e.g. HTCC or LTCC; that is, high or low temperature cofired ceramic), multilayer circuit board, 3D-formed such as thermoformed substrate, additively manufactured (3D printed) single or multilayer circuit board, additively manufactured circuit board comprising both electrically insulating and conductive material, multilayer substrate, film substrate, flexible film substrate, 3D-formed substrate, thermoformed substrate, molded substrate, injection molded substrate, extruded substrate, thermoformable substrate, thermoplastic substrate, polymer substrate, printed film substrate and patterned conductive polymer substrate.

In various embodiments, the node may comprise or at least thermally if not physically couple to a thermal management element, optionally cooling or heating element, further optionally comprising at least one element selected from the group consisting of: a heat sink, a thermal slug, and a thermal well.

In various embodiments, the first material layer defines, generally concerning the first material layer or the node as a whole, or locally in one or more places, essentially at least one shape, such as a cross-sectional shape, selected from the group consisting of: rectangle, trapezoid, frustum, isosceles trapezoid, isosceles trapezoid with shorter base facing the substrate film, isosceles trapezoid with longer base facing the substrate film, rounded shape, rounded rectangle, rounded isosceles trapezoid, triangle, rounded triangle, semicircle, dome, convex, bell-shape, mushroom-shape, conical, semi-ellipse, and droplet or column shape.

In various embodiments, the at least one functional or specifically e.g. at least partially electrical element comprises at least one element selected from the group consisting of: electronic component, integrated circuit, electromechanical component, active component, passive, component, electrical conductor, printed electrical conductor, printed electronics—produced electrical conductor, electrode, contact pad, conductor trace, electro-optical (or optoelectronic) component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, microelectromechanical (MEMS) component, UI element, user input element, vibration element, sound producing element, communication element, transmitter, receiver, transceiver, antenna, resonator, wireless communication element, wireless tag, radio tag, tag reader, data processing element, data storage or memory element, and electronic sub-assembly.

In various embodiments, the node may comprise a second substrate on a side of the first material layer that is opposite to a side facing the substrate and at least one functional such as electrical element thereon, wherein the second substrate is optionally configured for attaching the electrical node to a host structure or specifically host substrate thereof. Accordingly, the (first) substrate and the second substrate may establish a stacked structure having e.g. electronics and at least portion of the first material therebetween.

Yet, a multilayer structure may be provided, comprising an embodiment of at least one electrical node as described herein;

e.g. a molded or cast material layer at least partially covering said at least one electrical node and preferably (at least a portion of) a possible host structure, preferably comprising at least a host substrate, accommodating the electrical node, the material layer and optionally a number of further elements, such as thermal management elements, conductors, optical elements, and/or electronic components, thereon, wherein the first side or the opposite second side of the substrate of the electrical node optionally faces towards the possible host substrate.

According to a further aspect, a method for manufacturing a preferably electrically functional structure comprising an integrated, preferably electrically functional node, comprises:

obtaining a substrate hosting at least one, optionally printed and/or mounted, functional such as electrical element optionally so that it projects from a first side of the substrate, said substrate having the first side and an opposite second side, and provided with, e.g. therein and/or thereon, a number of connecting elements, optionally including contact pads or pins, for functionally, preferably electrically or electromagnetically connecting the at least one functional element with a circuit of an external structure; and providing a solidifiable first material layer in a pre-solidified state upon the at least one functional element, preferably essentially embedding the projected portion, if any, of said at least one functional element therewithin, and preferably further upon at least a portion of the first side of the substrate surrounding the at least one functional element to establish the integrated electrical node comprising said substrate, said at least one functional element and said first material layer that subsequent to solidification, optionally incorporating thermal and/or pressure curing, defines a protective covering;

wherein the first material layer, including its solidified state, comprises elastic material arranged to reduce at least thermal expansion related stresses between one or more elements included in the node, adjacent the node and/or at least at a proximity thereto, preferably between the connecting elements and at least one element of the external structure, such as a plastic layer molded or cast over the node; and optionally further wherein a second substrate is provided to a side of the first material layer that is substantially opposite to a side facing towards the substrate.

For example, a film-like and/or receptacle type mold, preferably being reusable or disposable, is utilized to accommodate and shape the material of the first material layer during solidification, wherein the mold optionally comprises at least one element selected from the group consisting of: metal, plastic, fibrous, wood, textile or fabric, lignin, ceramic and sacrificial material. In some embodiments, at least portion such as a layer of the mold could establish a portion of a finished node as well, e.g. a (protective) layer thereon.

In various embodiments, instead of or in addition to arranging a functional such as an electrical element upon the substrate such that it substantially projects from the first side of the substrate, a functional element may be provided in a recess, blind-hole (substrate material removed) or a through-hole established in the substrate. A recess may be obtained by forming such as thermoforming of the substrate either upfront or subsequent to the provision of the functional element thereon, for example, so that a recess shape is defined by the substrate. A hole may be obtained by removing substrate material or directly establishing the substrate from a concerned source material (by molding, for example) so as to the define the hole, for instance. Accordingly, the element may be accommodated by the recess or hole of the substrate in such a manner that it does not protrude at all or at least considerably or fully from the substrate. A smaller recess may still remain at the location of the element, partially filled by the element and e.g. the first material layer. The substrate may be provided with a flush first surface by embedding the functional element(s) therein.

In various embodiments, material of the first material layer may be applied, optionally by curtain coating, onto the substrate and then shaped according to selected target shape of the electrical node and related protective covering, optionally utilizing a roller or plate type mold.

In various embodiments, material of the first material layer may be provided in a flowable form onto the at least one functional element and the substrate, whereupon the material is at least partially let to naturally, without substantial active effort, or guidedly (e.g. curing of light-curable material by light) establish its final shape defining the protective covering according to at least flow properties thereof.

In various embodiments, material of the first material layer may be at least partially provided in a flowable form onto the at least one functional element and the substrate, wherein the substrate has been pre-prepared with at least one, permanent or temporary, guiding structure, optionally comprising a frame, to controllably limit material flow on the substrate and define the shape of the protective covering.

In various embodiments, the method comprises attaching the electrical node to a host structure, optionally upon a host substrate of the host structure, and providing or specifically, producing, optionally through molding or casting, e.g. a plastic layer upon the electrical node.

Different embodiments and related characteristics of the node discussed herein may be flexibly and selectively applied, mutatis mutandis, to desired embodiments of a related method of manufacture, and vice versa as being appreciated by a person skilled in the art.

In various embodiments, the first material layer may thus be of or comprise elastic material(s), such as elastomer or polyurethane, or alike materials or materials based thereon, which material(s) used may further be e.g. thermoplastic. For example, the material of the first material layer may comprise at least one resin or alike material, preferably selected from the group consisting of: plastic resin, polyurethane resin, acrylic resin, silicone resin, epoxy resin, siloxane resin, resin provided with at least one filler, and alike material. A base (host) material and/or a filler may be provided to achieve selected functionalities, which in the case of filler(s) may go beyond that provided by the resin (base) itself. Such functionalities may include e.g. dissipation or amplification of electromagnetic field, thermal conductivity or insulation, photon energy down- or upconversion, scintillation, electrical conductivity or insulation, and/or light diffusion among other options.

In various embodiments, the electrical node may comprise at least two substrates as already alluded to above.

At least one substrate hosts a number of functional such as electrical elements but there may several such substrates in the node.

At least one substrate may in addition to or instead of hosting elements such as electronics or thermal management elements, be configured for attaching the node to a host structure such as a host substrate. For the purpose the associated contact surface of the attaching substrate may be provided with one or more connecting or specifically attaching elements such as adhesive.

As mentioned hereinbefore, the electrical node preferably comprises at least one contact or connecting element at least functionally such as electrically or electromagnetically connected to the at least one functional element, wherein the at least one contact or connecting element is further configured for arranging functional, preferably electrical or electromagnetic connection, such as galvanic, capacitive, inductive, or optical connection, into the node and e.g. said at least one functional element, typically from the environment and/or exterior of the node (e.g. from the host structure/substrate, external system, related circuit(s) and electronics, etc.). The connection may be for data or information such as control data/information transfer, and/or power transfer, for example.

In various embodiments, the at least one connecting element may be arranged at least at a peripheral portion of the first material layer for providing the aforementioned functional such as electrical or electromagnetic connection into the node, such as via galvanic, capacitive, inductive, or optical coupling element or elements. A connecting element could be additionally or alternatively provided to reside or extend within the substrate, through the substrate, along the substrate surface and/or within the first (fill) material upon the substrate surface, for example.

In various embodiments, the connecting element may comprise at least one electrical or electromagnetic element such as a contact pin, pad, conductor, wireless connecting feature such as a loop or coil, (electronic) component such as a transceiver, transmitter, receiver, etc. The connecting element may comprise joint or dedicated elements, and e.g. one or more intermediate portions or features, for connecting to the functional element(s) of the node and to the external circuit of the host structure or other external system. In some embodiments, the connecting element may be at least partly physically integrated with some other element such as the functional, or specifically electrical element of the node (e.g. integrated circuit).

In various embodiments, the electrical node may comprise a second material layer arranged on the at least one functional element for reducing e.g. air pockets between the at least one functional element and the first material layer.

In various embodiments, the electrical node may intentionally comprise an air pocket within the first material layer e.g. in connection with a certain type of (electrical) element included. The air pocket or generally gas pocket may contain any one or more gases, such as air or inert gas(es), for instance. According to an embodiment, the pocket may be utilized to enable the operation of e.g. a microelectromechanical system (MEMS) element, such as a switch, which requires that there is some free space or volume for a part of the element to sufficiently move, for instance, to operate duly.

In various embodiments, the node, or an embodiment of a multilayer structure or assembly comprising at least one node (described in more detail herein later), further comprises at least one thermal management element, for cooling or heating purpose, for instance, such as at least one element selected from the group consisting of: a heat sink, a thermal slug, and a thermal well. The thermal management element may be arranged completely within the first material layer, or partly within/outside it, for example. It may be hosted by any of the substrates of the node, for instance. In some embodiments, the thermal management element may be arranged through at least one substrate and/or first material layer of the node via a suitable cut or a through-hole, for instance.

In various embodiments, element(s) such as thermal and/or electrical conductors, contacts or connectors, as a part of, connected or integral with the thermal management element, may comprise material having high thermal conductivity, such as of thick copper conductors.

In various embodiments, the thermal management element or elements, such as heat pipes, may be arranged in connection with one or more other features of the node, such as e.g. electrical connector or contact, to optionally operate e.g. as a heat sink or to conduct heat into or out of the node.

In various embodiments of e.g. the assembly or multilayer structure, at least one thermal management element may be located essentially outside the node, optionally integral or connected with an element such as electronic component, considering e.g. high-power LEDs prone to (over)heating in certain circumstances. A thermal management element may be a substantially monolithic element, multi-part element (the parts may be removably or fixedly connected), and/or integral with some other element(s), such as a connector or functional element.

In various embodiments, the thermal management element may be configured to at least thermally, if not e.g. physically and/or electrically, to connect or contact the node, a feature such as a functional element, fill, substrate, conductor, contact and/or connector thereof, other element outside the node, and/or e.g. (electronic) component of the multilayer structure or assembly including at least one node. The associated thermal connection may be convection, conduction and/or radiation based, for instance.

According to one aspect, an electrical node assembly, such as a strip or sheet, comprising a plurality of electrical nodes arranged e.g. in a matrix, row or other desired constellation, may be provided. The strip or sheet may comprise a first substrate film that hosts the nodes. It may optionally define e.g. a dedicated or shared cavity for each node. The assembly may be at least partially covered by e.g. molded or cast material layer and thus translated into an embodiment of a multilayer structure.

The present invention provides different advantages over a great variety of known solutions, naturally depending on each particular embodiment thereof. It generally reduces the complexity of selectively and effectively integrating and sealing various functionalities including electrical features such as circuits forming e.g. switch-mode power supplies or dense-pitch microcontrollers or generally integrated circuits, among other options, together and into assemblies or multilayer structures of desired configuration. In many cases the amount and size of required wiring, contacts or connectors, materials, process steps and/or other elements may be hugely reduced in contrast to prior art. The number of functionalities that can be easily embedded in an electrical node according to the present invention may greatly enhance value gained from implementing the structure and its functionalities with IMSE instead of using any of the available traditional technologies.

The fill (first) material in which the electrical features such as electronic components or essentially sub-assemblies (a sub-assembly may already comprise e.g. a printed circuit board (PCB) or other (sub-)substrate and a number of elements such as traces and/or components such as printed and/or mounted (electronic) components thereon) are at least partly embedded in the node, can be selected suitably in terms of e.g. elasticity so that it besides protecting the embedded features chemically or mechanically from external shocks or provision of overcast or molded layers, for example, further evens out e.g. thermal expansion related mismatches and induced stresses between different elements within the node, adjacent the node or at least at a proximity thereto. Yet, the fill material preferably reduces mechanical deformation related strain in the structure.

Accordingly, components and traces among other embedded features remain undamaged in their intended positions even if the node or a greater multilayer structure comprising e.g. multiple nodes is subjected to varying conditions and/or internal features thereof such as electronics generate heat that could otherwise lead to thermal expansion related problems such as breakage, detachment or mutual dealignment of at least some of the features. Preferred material may have substantially rubbery consistency in its finished, solidified state, for example. Yet, the material advantageously provides good adhesion to neighboring materials of e.g. functional such as electrical elements, molded or cast layers, substrates, etc. Still, the material may be e.g. thermally conductive or be supplemented with such filler or other thermal management features to desired extent to further facilitate thermal management of integrated electronics. By inclusion of thermal management elements in the nodes, assemblies or multilayer structures as discussed herein many potential thermal management related issues such as overheating of electronic components may be reduced or avoided.

Still further, the material may be provided in substantially opaque or clear (optically transparent or at least translucent having regard to selected wavelengths such as the ones of e.g. embedded light source(s) such as LED, light detector and/or visible light) construction, which facilitates establishing e.g. optically functional features such as waveguides, lenses, diffractors, collimators, reflectors, and masks therefrom. Further, the material may be selected such that it retains its color/does not easily discolor due to exposure e.g. heat (e.g. 120 degrees Celsius could be considered sufficient) and/or high-energy photons such as blue and/or UV light. The material may in some embodiments be of composite type and the constituent materials, e.g. base and one or more fillers, can be provided in desired constructions, defining different shapes such as planar layers, rounded shapes, channel or tunnel forms, etc. Even further, the material may have desired electrical and/or electromagnetic properties in terms of conductivity and insulation capability, and or the material may be e.g. luminescent as discussed herein elsewhere.

The electrical node generally has a structure that can be optimized for efficiency, low electromagnetic interference (EMI) or other parameters, for instance. For example, a switch-mode circuitry can be tailored to meet emission limits with greatly reduced risk for failing results in electromagnetic compatibility (EMC) tests. From a software developing perspective, the effort required to implement IMSE structures can also be greatly reduced, as pre-selected and pre-manufactured electrical nodes will have known structure and known, well tested functionalities in contrast to solutions that have to be designed from scratch each time. Providing drivers with the possibility to auto-generate driver code based on pre-configurable functionality models can enable implementing the functionalities.

Finally, the electrical node approach enables using a much greater proportion of currently available electrical components: most of the new components released to the market are packaged in very dense, tiny packages with potentially very high power density that are challenging to directly integrate in IMSE structures due to physical limitations: print resolution, adhesive spreading and splatter, reliable filling and exclusion of air, for example. For a designer not intimately familiar with the challenges in directly embedding complex circuitry and many components in plastic, the electrical node approach is significantly safer way to integrate the desired functionalities into a component-like entity.

Various other advantages will become clear to a skilled person based on the following detailed description.

The expression "a number of" may herein refer to any positive integer starting from one (1).

The expression "a plurality of" may refer to any positive integer starting from two (2), respectively.

The terms "first", "second", "third" and "fourth" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Various embodiments of electrical nodes, related further assemblies, multilayer structures and methods of manufacture are described below, to be optionally flexibly and/or selectively combined by a person skilled in the art upon need to come up with new embodiments best suitable for each concerned use scenario.

Figure 1:
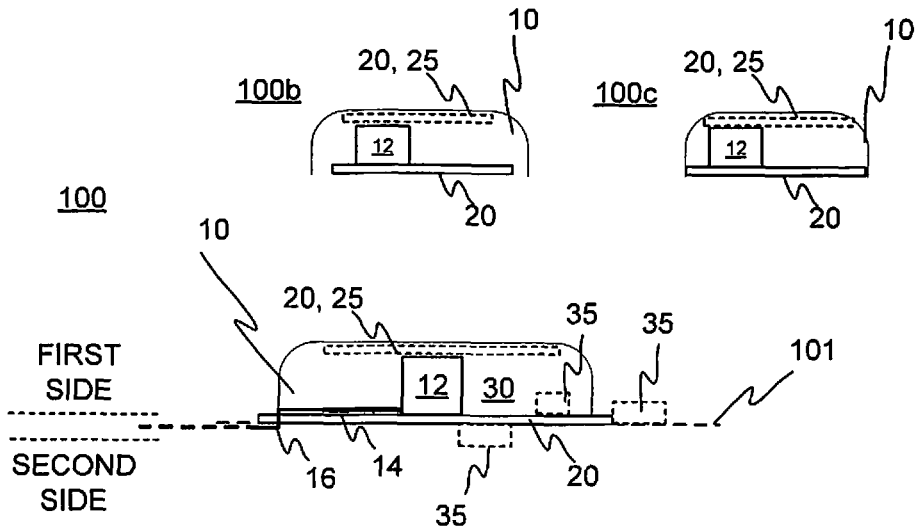
FIGS. 1 and 2 illustrate schematically electrical nodes according to few embodiments of the present invention.

FIG. 1 illustrates schematically an electrical node 100 according to an embodiment of the present invention. The illustration could be considered to represent e.g. a cross-sectional view of the node 100, or a side view when containing essentially optically clear (transparent or at most slightly translucent) fill material.

The electrical node 100 in FIG. 1 comprises at least one substrate 20, e.g. a film or a rigid PCB (printed circuit board) type substrate as discussed hereinbefore. There could be several substrates 20 included in the node 100, positioned e.g. mutually parallel and/or on different levels (depths/heights) within the node 100. The broken line 101 illustrates a hypothetical target surface such as a surface of a host substrate on a host device or other host structure whereto the node 100 is ultimately provided upon installation. A substrate 20 may be essentially planar or contain at least local 3D shapes such as one or more protrusions (e.g. dome shapes), recesses (e.g. receptacle shapes), curved shapes, angular shapes, etc., optionally obtained by 3D forming such as thermoforming of a substrate film either prior to or subsequent to provision of further elements such as one or more elements 12, 14 thereto.

In any case, the node 100 may include a substrate 20 that besides facing, is configured to directly contact a host surface upon installation in a host structure. Alternatively or additionally, the node 100 may include a more remote or more deeply embedded substrate 20, depicted in FIG. 1 using a rectangle drawn with broken lines, which is positioned farther away from the intended contact surface or interface with the host structure 101 (in the illustration this type of substrate 20 is positioned closer to the top surface of the node 100 if not even defining at least a portion of such top surface or generally a surface that is remote if not essentially most remote surface from the host 101).

A substrate 20 may accommodate or host a number of different, preferably functional, elements such as electrical elements e.g. on at least first side thereof, which in this context refers to e.g. electrical, electro-optical, electromechanical or specifically electronic components 12 and/or conductors 14 such as traces, or 'wiring', and/or contact pads for electrically connecting components together according to a selected circuit layout or circuit design, for instance. Also the opposite second side may contain a number of electrical elements 12, 14 and/or other elements generally discussed herein, and/or be utilized for defining exterior surface of the node 100, which may optionally be further utilized for attaching the node 100 to a host.

Yet, a number of connecting elements 16 for functionally, preferably electrically, such as galvanically, and/or electromagnetically, e.g. inductively, capacitively or optically using e.g. light, coupling the node 100 and one or more electrical elements therein to an external electrical circuit such as a circuit of a host structure may be provided in the node 100. Thus, both wired and wireless connecting technology may be applied.

Item 35 refers to a number of potential thermal management elements that may be provided (mounted or printed, for example) within, adjacent or farther away from the node 100. Reference numeral 25 in turn indicates a number of potential further elements that could be included in the node 100, with reference to e.g. one or more graphical or optical elements such as light directing, blocking or processing elements (e.g. light-conveying element/lightguide, reflector, mask, collimator, diffuser, lens etc.). The further elements 25 could include ready-made elements or printable elements using e.g. clear or colored ink, for example. In some embodiments, various elements such as any of aforementioned elements could be at least partially provided to the substrate 20 using also selected subtractive technique(s) in addition to or instead of other techniques such as printing and/or mounting.

In more detail, the node 100 may generally comprise a number of thermal management features or elements such as a heat sink for cooling the node 100, particularly any of electrical elements 12, thereof. The heat sink and/or other thermal management or specifically heat exchanging feature(s) may be embedded e.g. into the first material layer 30 and/or provided at least partly outside of the node 100 (utilizing e.g. a via/hole provided in the exterior optionally prior to or subsequent to e.g. provision of cover plastics thereon using e.g. molding) in order to provide cooling, for instance. Generally, a thermal management element or feature may have a high thermal conductivity and e.g. heat dissipation properties, provided by the included material(s), dimensions, shape and/or (surface) area thereof. The material(s) may include many metals (e.g. copper, silver, aluminium) and their alloys in addition to or instead of e.g. thermally conductive polymers, pastes, molded material(s), for instance. In some embodiments, a thermal management element that is essentially a thermal insulator, may be utilized in addition to or instead of thermal conductors.

A thermal management element 35 may advantageously be configured to distribute, convey or spread thermal energy/heat within and/or outside the node 100. Thermal energy or heat may be conveyed to a selected or whole area of the node 100, and then outside the node 100, for example, through internal substrate 20 or a host substrate, therefore, yielding e.g. more efficient cooling of the node 100 with respect to providing cooling at a single point. This may be particularly beneficial if the node 100 comprises compact high-power components, such as high-power LEDs or LED drivers, in order to avoid hotspots.

In various embodiments, the thermal conductivity of such thermal management element 35, or at least a part of it, may preferably be at least 2 W/mK, or preferably at least 10 W/mK, or more preferably at least 50 W/mK, or most preferably at least 100 W/mK. As being appreciated by a person skilled in the art, various materials having a lower thermal conductivity may be considered as thermal insulators whereas materials associated with a higher thermal conductivity may be generally more effectively utilized as thermal conductors e.g. for cooling/heat transfer purposes. The desired thermal conductivity may be obtained by suitable material selection of the thermal management element 35, for instance. In some embodiments, plastic material having thermal conductivity at least 10 W/mK may be utilized. In various embodiments, metal material, such as copper, aluminium, zinc, or tin-silver-copper (SnAgCu) composition, such as Sn—Ag3.5-Cu9.0, may be utilized in the thermal management element 35 or at least in part thereof. Thermal conductivities of various such metals are of the order of at least about 60 W/mK. Thus, quite many metals offer a better thermal conductivity than typical plastic materials, which may be exploited in various embodiments of the present invention for thermal management.

In various embodiments, the thermal management element 35, such as a thermal well, a thermal slug or a thermal pad, may be implemented at least partly by e.g. a lead frame, such as comprising of copper or copper alloy, of an electrical or electronics component. Furthermore, e.g. a thermal well may be implemented by a matrix of inlets through a substrate, such as a PCB. Thermal wells may particularly advantageously be utilized in multilayer substrates. Examples of thermal slugs or pads may comprise thermally conductive material arranged on a thin-shrink small-outline package (TSSOP) or on a quad-flat no-lead (QFN) package.

According to an embodiment, the electrical node 100 may comprise a circuit board, such as substrate 20, or an electrical element 12 having a metal core or based on multilayer ceramics technology, such as high temperature co-fired ceramics (HTCC) or low temperature co-fired ceramics (LTCC), which may further provide cooling and/or heating through thermal conduction.

According to an embodiment, the thermal management element(s) 35 may, in addition to or instead of comprising dedicated element(s), be integrated with a number of elements and/or components of the electrical node 100. For example, this may entail utilizing electrical conductors designed with such properties, such as dimensions, that they function as a thermal management element 35 or at least a portion thereof, such as a heat sink or thermally conductive element.

In various embodiments, the electrical node 100 may comprise a thermal management element 35, such as at least one of the following: a heat sink, a thermal slug, a thermal well. The thermal management element 35 may be arranged to remain fully or partly within the material 30 or at least partly outside it, for example. The thermal management element 35 may, additionally or alternatively, be arranged through the exterior of the node 100 via a cut or a through-hole, for instance. Furthermore, the thermal management element 35 may be arranged the extend through the substrate 20, if any. In some embodiments, the electrical connecting element 16, as a part of the thermal management element 35, may comprise or consist of material having high thermal conductivity, such as of thick copper conductors. The thermal management element 35 or elements 35, such as heat pipes, may alternatively or additionally be arranged in connection with the element 16 for operating as a heat sink or to conduct heat into or out of the electrical node 100.

In various embodiments, the electrical node 100 may comprise a thermally conductive first material layer 30 to operate, in addition to being e.g. a protective layer, as a thermal management element 35. Still further, the first material layer 30 may be provided only partly, such as at corresponding positions with heat generating components, such as processing units or resistors, by utilizing thermally conductive material while the rest of the first material layer 30 may be of other material.

According to various embodiments in which the electrical node 100 has been arranged on a host substrate or structure (see e.g. the structures of FIGS. 3-8 and 14), the thermal management element(s) 35 of the node 100 may have been arranged in thermal connection with external thermal management element(s) 35 of the host substrate. For example, there may be graphite or copper, such as pieces of graphite or copper tape, arranged on the host substrate with corresponding positions with the electrical node 100. Still further, these thermally conductive elements could extend along the host substrate to conduct heat away, for example, from the node 100.

In various embodiments comprising the electrical node 100 arranged on a host substrate or structure, and comprising a molded or cast material layer on the node 100, at least part of the molded or cast material layer may be of thermally conductive material.

Elastic material layer 30 has been provided, preferably by molding such as injection molding or casting, at least upon the first side of the substrate 20 so that the electrical element(s) 12, 14 and potentially further elements 25, 35 are at least partially if not substantially fully embedded in the concerned one or more materials of the layer 30. Accordingly, the material 30 defines a protective covering 10 upon the substrate 20. One could also consider it forming a body (fill) of the node 100, potentially together with the included substrate(s) 20.

Depending on the used manufacturing method, materials and e.g. mold shapes, if any, the layer 30 and generally the node 100 may exhibit one or more different shapes. For example, there may be the shape of a rectangle, trapezoid, frustum, isosceles trapezoid, isosceles trapezoid with shorter base facing the substrate film, isosceles trapezoid with longer base facing the substrate film, rounded shape, rounded rectangle, rounded isosceles trapezoid, triangle, rounded triangle, semicircle, dome, convex, bell-shape, mushroom-shape, conical, semi-ellipse, and droplet or column shape, to name a few.

Therefore, a skilled person shall realize the fact that the shown embodiment 100 with rounded rectangular shape is merely exemplary and still merely exemplary further shapes are shown e.g. at 100b and 100c.

Yet, the illustrations 100, 100b, 100c further depict various alternatives for aligning the borders of the material layer 30 and the substrate 20. As shown at 100, the first side on the substrate 20 on which the layer 30 has been configured may still remain free from the material of layer 30 e.g. at the periphery (near the edges) thereof. Alternatively, as sketched at 100b, the layer 30 may go even beyond the edges of the substrate 20. As a further option as shown at 100c, the layer 30 and the substrate 20 could be aligned so that the layer 30 basically covers the whole (first side of) the substrate 20 but does not essentially go beyond the edges thereof.

Figure 2:
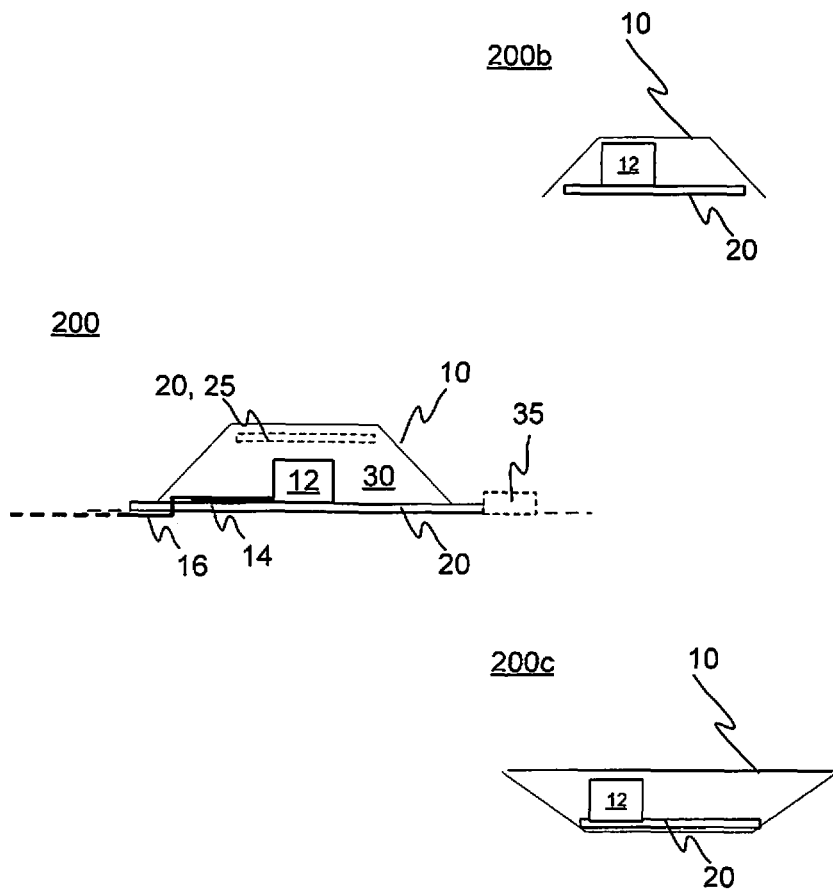

What has been stated above relative to FIG. 1 is applicable in connection with the embodiments 200, 200b, 200c of FIG. 2 as well, and is therefore not unnecessarily repeated. FIG. 2 basically discloses alternative side or cross-sectional shapes for the nodes. So, instead of e.g. substantially rectangular shapes, various mushroom or trapezoidal such as isosceles trapezoidal shapes are applicable as well.

Any of the elements 12, 14, 16, 25, 35 may be of attachable or mountable (ready-made) type, or directly additively printable (screen printed, inkjetted, etc.) or otherwise producible upon a target surface such as a surface of the substrate 20, for example.

Figure 3:
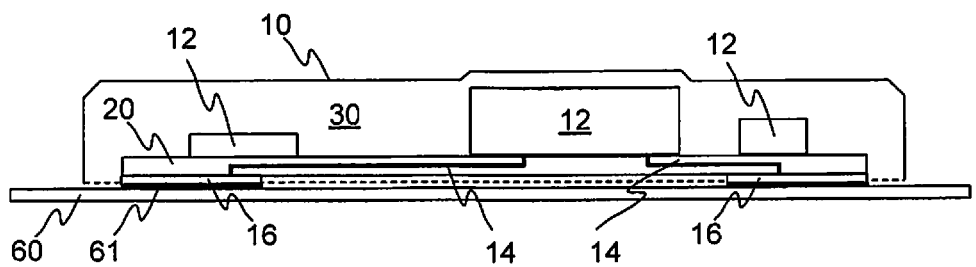
FIGS. 3 and 4 illustrate schematically electrical nodes according to further embodiments of the present invention.
Figure 4:
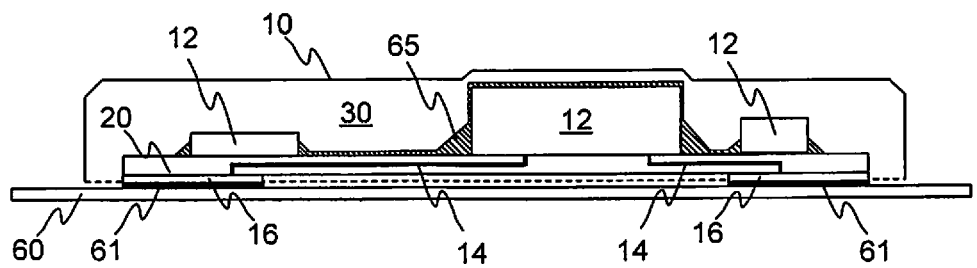

FIGS. 3 and 4 illustrate schematically electrical nodes 300, 400 according to further embodiments of the present invention. These nodes 300, 400 may generally follow the basic principles of electrical nodes set forth herein elsewhere, whereupon the related details are omitted here to avoid unnecessary repetition. Yet, the figures have been supplemented with some additional elements such a host substrate 60 that may accommodate one or more nodes 300, 400 and be further covered by e.g. cast or molded material layer(s) to come up with different multilayer structures discussed in more detail herein later in connection with the description of FIG. 6, for example.

As already mentioned above, a host substrate 60, such as a PCB or a film type substrate of e.g. plastic and/or organic material, may be provided and at least one electrical node 100 arranged thereon in addition to potential other elements such as electronics, optics, thermal management elements, etc. The host substrate 60 preferably comprises electrical connecting elements such as contacts or contact areas 61 provided with electrically conductive material to which the electrical node 100 may be, for example, attached by using conductive adhesive or solder, for example. The elements 61 may be configured to co-operate with the connecting elements 16 of the node 300 so as to provide desired functional, or specifically electrical, connection between the internals such as embedded electronics of the node 300 and external circuits. The electrical node 300 is thus, in accordance with a related general philosophy, a component-like entity configured to perform one or several functionalities depending on the included elements 12, 14. The connection between the node 300 and the host substrate 60, although shown as galvanic connection, may as well be arranged electromagnetically as capacitive or inductive (or optical) connection and thus even wirelessly. Furthermore, the material layer 30 of the electrical node 300 besides reducing detrimental effects of thermal expansion differences between various elements, advantageously protects the components of in the cavity 15 when being overmolded by plastic and/or generally covered by further material, for instance.

The electrical node 400 in FIG. 4 is generally similar to one shown in FIG. 3 except that specific material or material layer 65 has been provided therewithin e.g. on the at least one electrical element 12 for reducing air pockets forming between the at least one electrical element 12 and the first material layer 30. The material(s) 65 may differ from the one(s) of the primary fill (first layer) 30. The second material layer 65 may be covering the at least one electrical element 12, or at least some of them, if many, and, optionally, also at least part of the second substrate 20. The second material layer 65 may comprise or be, for example, of very easy-flowing and thoroughly wetting material, such as of liquid resin. The second material layer 65 may advantageously be used as a pre-filling material which flows into small gaps between electrical elements 12, such as electronic components, and/or parts of the structure and, thus, simplifies the geometry and/or "smooths" the surface(s) for facilitating the application of the first material layer 30.

The second material layer 65 may be of or comprise material, or a similar material, that is typically used in capillary underfill of IC components, for example. The material layer 65 may, thus, be of a mixture of liquid organic resin binder and inorganic fillers. The organic binder may comprise, for example, epoxy resin mix or cyanate ester. Inorganic filler may include, for example, silica.

Even though not being explicitly shown, in some embodiments of an electrical node a film or other type of additional layer could have been provided upon the material layer 30 e.g. for protective, optical (it may contain a visual such as a graphical pattern, indicative and/or masking features) and/or attaching purposes using e.g. suitable lamination (e.g. pressure, heat, and/or adhesive) or molding technique. The additional layer could thus define at least portion of the exterior of the node.

Figure 5:
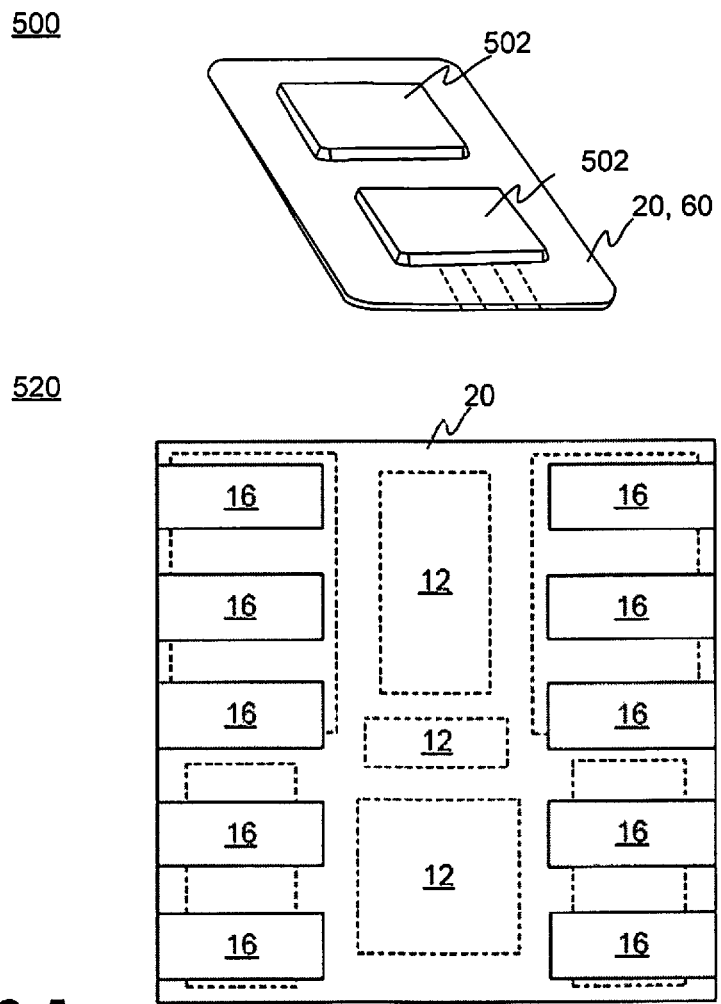
FIG. 5 illustrates schematically embodiments of an assembly and a sub-assembly utilizable in connection with an electrical node according to the present invention.

FIG. 5 illustrates schematically an electrical node strip or sheet type embodiment of an assembly according to the present invention at 500. Yet, at 520, a sub-assembly that could be included in an electrical node is shown. A sub-assembly may contain e.g. a substrate such as circuit board (e.g. PCB) of its own, called herein as sub-substrate. Yet, the sub-assembly may comprise various functional elements such as electronic components and/or traces provided to the potential (sub-) substrate.

At 500, the representation illustrates e.g. an elongated substrate 20, 60, such as a substrate film, which is configured to host multiple nodes or subassemblies 502, optionally in one or more recesses formed in the substrate 20, 60.

At 520, an embodiment of a sub-assembly utilizable in an electrical node 100 is shown. The sub-assembly 520 may comprise a plurality of functional elements such as one or more electrical elements 12, 14, preferably including interconnected elements, forming an internal electrical circuit of the sub-assembly. The sub-assembly may further comprise, for example at the peripheral part thereof, inputs and/or outputs, in a form of electrical contact or generally electrical or electromagnetic, or other type of, connecting elements 16, such as for electrical power, ground, control signals, and/or (other) data. It should further be noted, however, that various different kinds of sub-assemblies or electrical circuits having and/or configured to perform one or several functionalities may be arranged into electrical nodes according to different embodiments of the present invention, being not limited to the electrical circuit described hereinabove or depicted in the figure.

Figure 6:
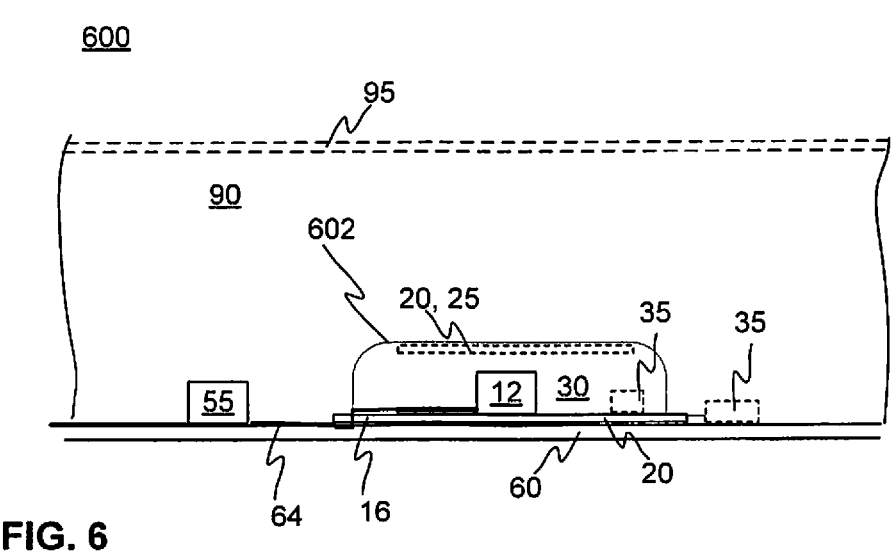
FIGS. 6, 7 and 8 illustrate schematically multilayer structures according to respective embodiments of the present invention.
Figure 7:
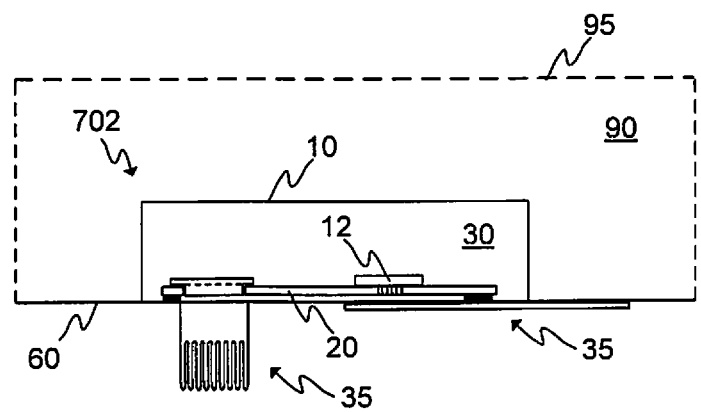
Figure 8:
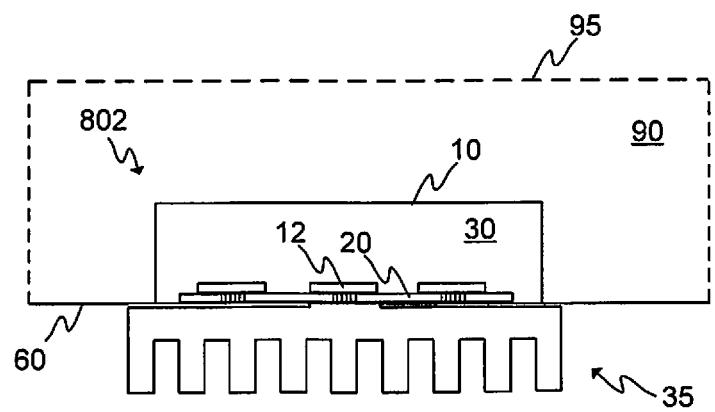

FIGS. 6-8 illustrate schematically multilayer structures according to respective embodiments of the present invention.

A multilayer structure 600 may comprise at least one electrical node 602. The features that may be included in such node and what kind of overall configuration and shape the node 602 could have, are discussed herein elsewhere to reasonable extent in connection with the description of different embodiments of the actual nodes, whereupon related considerations are omitted now to reduce unnecessary repetition and redundancy. Nevertheless, the structure 600 may comprise one or more, mutually different or similar (in terms of e.g. included elements and/or functionality) nodes 602 provided on a host substrate 60 such as a substrate film, and e.g. a molded or cast, or otherwise produced, material layer 90 at least partially covering the electrical node(s) 602. Two or more nodes could have been then e.g. electrically connected together by intermediate features such as electrical conductors of a circuit design provided in the structure 600. Two or more nodes 602 may have been originally manufactured or afterwards mounted (thus containing their own, dedicated substrates as well) on a common substrate such as the substrate 60.

As with the material 30, the material layer 90 may be at least partly electromagnetically or specifically, optically transparent or translucent having regard to selected wavelengths and thus e.g. visible light could travel through the layer 90 if considered beneficial e.g. from the standpoint of the operation of the multilayer structure (e.g. illumination or indicative function based on light) and/or node(s) 602 included therein.

Furthermore, an optional layer such as a further substrate and/or film 95, if any, could be provided and optionally configured, e.g. with colored ink and/or (other) masking features, to define a number of decorative and/or functional elements, such as transparent or translucent windows, for at least locally passing light through, as emitted by external light source or a LED or other internal light source of the node 602 or generally of the structure 600, for instance. Generally the material of layer 95 could be substantially opaque, translucent or transparent having regard to selected wavelengths such as visible light. As mentioned herein elsewhere, besides light sources the nodes 602 and structures 600 may include light detectors or generally light or radiation sensitive elements, whereupon they may prefer from being in optical or electromagnetic connection with the environment outside the concerned node 602 or even structure 600.

Yet, the structure 600 may host a number of elements such as electrical elements or specifically conductors such as traces 64 and/or electronic components 55 provided (mounted, printed, etc.) on the host substrate 60 and optionally at least partially also embedded in the layer 90, for instance. At least some of such elements 55 may be functionally such as electrically coupled to the node(s) 100, and e.g. element(s) 12 therein, via applicable connecting elements such as contacts and/or conductor traces, optionally defining at least a portion of a greater circuit design upon the host substrate 60, for example.

FIG. 7 illustrates schematically a further embodiment of the electrical node 702 and multilayer structure 700, provided with a number of applicable thermal management features, or elements 35. In the shown embodiment, as with various other embodiments incorporating thermal management elements, a thermal management element 35 may comprise a heat sink which may be optionally arranged at least partly, such as having a minor portion thereof, or about or over fifty, sixty, seventy, eighty, or ninety percent of the element (e.g. volume, area, and/or weight), outside the electrical node 702. However, in various embodiments the heat sink could be located at least partly inside the node 100 and/or specifically the material layer 30. There may preferably be a thermal conduction path, such as one through an opening in the host substrate 60 and/or the substrate 20, if any, between the thermal management element 35 and electrical elements, such as the at least one electrical element 12 arranged into the node 702 and generating heat when e.g. powered and/or used. The thermal conduction path could additionally or alternatively comprise thermal conductive paste and/or thermally conductive parts or layers essentially arranged in contact with each other to form the path.

In various embodiments, thermal and electrical conduction paths may be at least partially arranged by at least one common element in addition to or instead of dedicated elements, such as a connector or conductor comprising e.g. selected metal and/or other material, conducting both heat and electricity. Furthermore, there may be thermally conductive material, e.g. graphite or copper, such as pieces of graphite or copper tape, arranged on the host substrate 60 and/or on an outer surface of the node 702. Optionally, a connecting element such as a connector of the node 702 connecting to an external circuit could host, be attached to, or define at least portion of a thermal management element 35.

FIG. 8 illustrates schematically still a further embodiment 802 of the electrical node, provided with a number of related thermal management elements 35. The thermal management element 35 may be arranged by injection molding with thermally conductive material. Such a thermal management element 35 could be established by a two-shot molding technique, for example. There may preferably be an opening, such as a cut or the hole or through-hole in the node 802 such as in the substrate 20 so that the material of the thermal management element 35, such as of a heat sink or a heat pipe, gets close enough to the heat generating element of the node 802.

Figure 9:
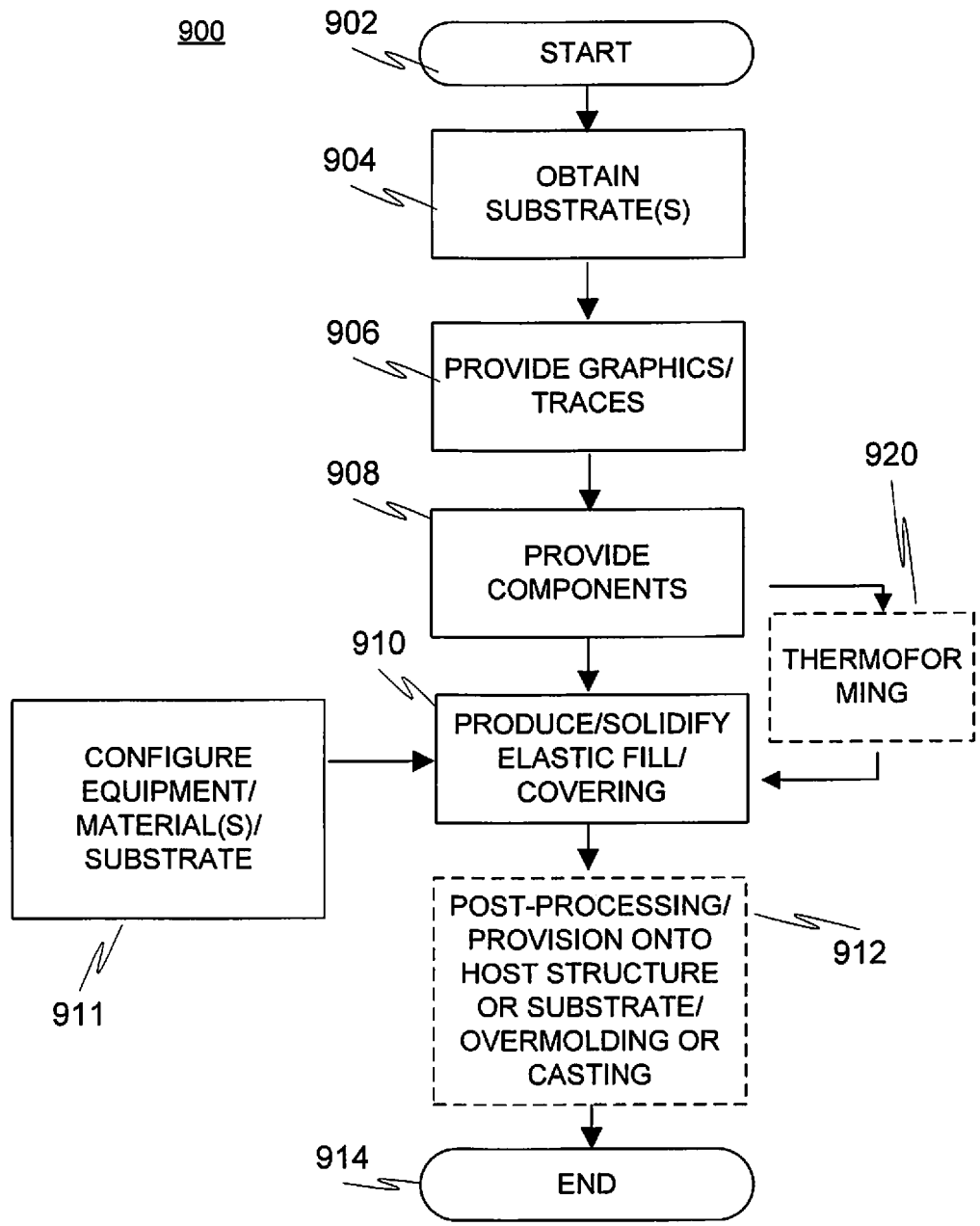
FIG. 9 illustrates a flow diagram of a method according to an embodiment of the present invention for manufacturing an electrical node or a related assembly or multilayer structure.

FIG. 9 illustrates, at 900, a flow diagram of a method according to an embodiment of the present invention. At the beginning of the method for manufacturing an electrical node, a start-up phase 902 may be executed. During start-up, a number of necessary tasks such as material, for example substrates, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cutting, drilling and/or printing equipment, among others, may be thus ramped up to operational status at this stage.

At 904, at least one substrate to be included in anode may be obtained. A substrate may include e.g. a plastic, potentially flexible, substrate film or a PCB. According to one alternative, a substrate may be obtained by manufacturing it from suitable source material(s), optionally by extrusion or e.g. injection molding. Preferably the substrate(s) comprise electrically insulating material but also e.g. composite substrates with heterogenous portions in terms of e.g. electrical conductivity and/or other properties may be utilized. The substrate(s) may be essentially planar, for example. In some embodiments, a ready-made element of substrate material, e.g. a roll or sheet of plastic film, may be acquired.

Optionally, the substrate is processed. It may be, for example, coated, drilled, cut and/or provided with openings, notches, recesses, holes, cuts, etc. as desired. The initial and/or resulting processed substrate may bear e.g. rectangular, square or circular shape. The substrate may be either generally or at least selectively in places opaque, translucent or substantially transparent having regard to selected frequencies/wavelengths of light, such as the emission frequencies/wavelengths of a light source, or detection frequencies/wavelengths of a light detector, to be provided thereon. The substrate may comprise thermoplastic material but as discussed herein elsewhere, a great variety of mutually rather different materials are applicable for use in substrates and other elements considered herein.

Next, a number of functional elements may be provided to the substrate.

At 906, the substrate(s) may be provided with electrical wiring and/or graphics, for instance. Printed electronics technology such as screen printing, inkjetting, flexographic, gravure or offset lithographic printing may be utilized for the purpose in addition to potential other methods such as etching in connection with PCB type or alike substrates. A general circuit layout may be thus provided on the target substrate(s).

For example, a number of conductive traces defining e.g. a number of conductor lines of a desired circuit pattern or circuit design, and/or contact pads (or other contact areas) for electrically coupling electronic components are provided on the target substrate(s), Also further actions cultivating the substrate film involving e.g. printing or other provision of color layers, graphics, visual indicators, electrical insulators, coatings, etc. may take place here.

At 908, a number of components such as electrical or electronic components may be provided on the substrate(s) by mounting (e.g. SMD type i.e. surface mount technology components) and/or additively by printed electronics considering e.g. OLEDs. Adhesive (optionally e.g. electrically conductive one) and/or solder may be utilized for fastening the components, for instance.

Yet, a number of electromechanical or electro-optical elements may be provided.

Additionally, a number of further features such as thermal management elements (cooling elements etc.) comprising thermally conductive material could be provided at this stage and/or later to the node under construction. For example, a heat sink, thermal slug or thermal well could be provided.

Item 920 refers to optional forming of any of the substrates to render them into desired 3D shape when applicable. For example, thermoforming may be utilized. Alternatively, forming could take place prior to provision of e.g. components 908 on the concerned substrate, but in that case 3D assembly would be required to subsequently install ready-made components or other elements on the already three-dimensional target.

In more detail, in some embodiments the substrate film(s) and/or other film(s) to be included in the node or a hosting multilayer structure may indeed be formed to exhibit a desired 3d-shape (at least locally a substantially non-planar shape), preferably through thermoforming such as vacuum or pressure forming. Also cold forming may be applicable.

Having regard to forming techniques, e.g. the aforesaid pressure forming may be applied to provide the substrate with precise, sharp details; pressure forming may also be generally preferred when the substrate lacks (through-)holes that could enable undesired flow and resulting pressure drop via them. Forming may be applied to provide e.g. a recess in a substrate for at least partly accommodating one or more functional elements of a node and optionally material of the first material layer. Even several such recesses could be formed in a common substrate. A single node could then incorporate regions of one or more recesses on a substrate that may be dedicated to the node. Yet, a common substrate could be provided with several recesses, each relating to a separate node, which could be still at least functionally mutually connected by e.g. overall circuit design comprising electrical conductors connecting to the nodes.

Yet, it is possible to provide an already integrated sub-assembly of electronics/sub-substrates (e.g. PCBs, printed circuit boards, already supplied with electronic component (s)) to any of the substrates and secure it by adhesive (optionally conductive) and/or solder, for instance. An electrical node, while itself ultimately being an integrated sub-assembly, may incorporate one or more constituent sub-assemblies as included electrical elements thereof.

At 910, one or more materials constituting at least the first material layer (i.e. primary fill) of the node are provided preferably in a pre-solidified state upon and/or into the substrate, essentially embedding at least portion of various elements such as traces and/or components provided at items 906 and 908 therewithin to establish an integrated electrical node subsequent to solidification, optionally incorporating thermal, optical and/or pressure curing, of the material(s). Different embodiments for carrying out item 910 are illustrated in FIGS. 10-14 and described in more detail in the related text. Supplementary fill materials may be provided next if not already provided prior to the primary fill. Different materials may also be alternately provided. One or more internal cavities such as optical conduits may be formed e.g. by alternating materials (e.g. transparent/translucent material vs opaque material or a material with higher refractive index vs a material with lower refractive index so that e.g. total internal reflection based propagation of light may occur at the interface thereof) within the node for conveying light or other purposes. Yet, the first material layer may include a base material provided with one or more fillers having desired functionalities as discussed herein elsewhere.

Item 911 may refer to preparation activities regarding item 910 such as provision of possible guiding structures on the substrate to limit the flow of the material(s) of the first material layer.

At this stage or at item 912 (if not already at 908, for example) the method may further comprise providing at least one e.g. electrical contact or connecting element to the electrical node. The element 16 may be electrically connected to the at least one functional such as electrical element 12. The element 16 may be configured for providing a desired electrical or electromagnetic connection, such as galvanic, capacitive or inductive, if not optical, connection, into the node 100, especially from outside the node 100, e.g. from a host structure or a host substrate. This may entail, for example, having electrical contact pads 16 which may be optionally later attached, such as soldered or by using conductive adhesive, to electrical contact elements of a host substrate, such as a PCB or (plastic) film, for instance. According to various embodiments, the element 16 may be arranged at a peripheral portion of the node or specifically e.g. substrate or fill therein, for providing electrical connection into the node 100. Instead of or addition to electrical connection and connection element(s), electromagnetic coupling such as inductive or capacitive coupling capable connection element(s) could be provided in the form of e.g. corresponding coupling loops.

One or more nodes and supplementary further elements such as thermal management elements, (electronic) components and/or traces may be thus provided to a common host substrate. For example, adhesive may be utilized for the purpose and dispensed in desired locations of the host and/or a node or other element for securing the node/element to the host. As alluded to above, in some embodiments the adhesive may be electrically conductive to provide electrical connectivity in addition to mechanical fastening properties.

One or more nodes and optionally further elements provided and/or originally established on a common substrate may be selectively covered by e.g. molded or cast material, coating, film, etc. to establish a desired integral multilayer structure as described herein elsewhere, for instance.

Indeed, in addition to or instead of node-integrated thermal management elements such elements may be provided e.g. on a host substrate of a multilayer structure outside any electrical node, either after provision of the nodes or prior to it.

A feature such as a connector, other connecting element or a conductor may in some embodiments, besides its other or possible "primary" function, have also e.g. a thermal management function as discussed hereinearlier, which may be taken into account in the design of the feature having regard to e.g. material selection (for instance, both electrically and thermally conductive material such as a suitable metal may be used) and shape/dimensions.

At 914, method execution is ended.

Figure 10:
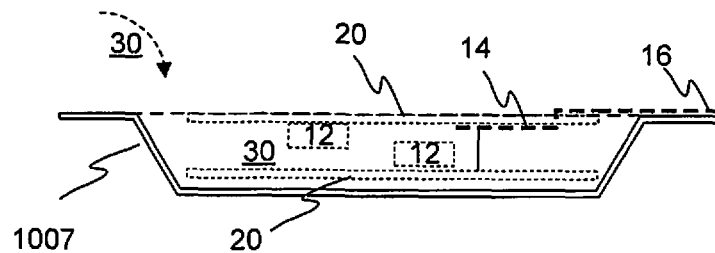
FIG. 10 illustrate various potential stages of manufacturing an electrical node according to an embodiment of the present invention generally utilizing a mold.

FIG. 10 illustrates, at 1000, manufacturing an electrical node according to an embodiment of the present invention generally utilizing a mold for the provision of the fill material.

At least one substrate 20, provided with a number of desired elements such as electrical elements 12, 14, connecting elements 16 and/or thermal management elements, may be arranged in a desired orientation into a receptacle defined by a mold 1007. Options to position a substrate 20 into the mold 1007 such that the elements provided on a side thereof face either towards the bottom of the receptacle or the opening on the opposite side have been illustrated in the figure by broken lines. The elastic material 30 to at least partially embed one or more of the elements, if not all the elements, has been provided in the receptacle upfront and/or is provided afterwards in a flowing state. Solidification of the material may be assisted or guided e.g. thermally or by pressure, depending on curing characteristics thereof, for example. After solidification the established node may be removed from the mold 1007, or the mold 1007 removed from around the node optionally by breaking it in case the mold 1007 is of disposable type. How the node is oriented on a host substrate, may be determined case specifically. In the illustrated case, the node could be positioned so that a shorter base or a longer base of the established substantially isosceles parallelogram shape contacts the host, for example.

A skilled person will readily apprehend the fact that in various embodiments of the node, the elements of the node such as electrical elements 12, 14, connecting elements 16 or thermal management elements may be positioned in the node, besides taking possible manufacturing related constraints into account, based on the intended later alignment of the node relative to a host substrate to ensure that the elements can function as desired when installed at the host.

Figure 11:
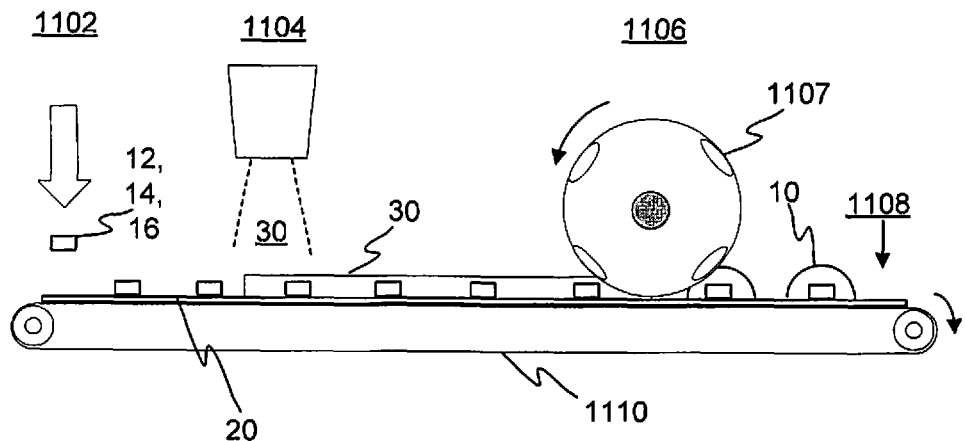
FIG. 11 illustrates an embodiment of a manufacturing method in accordance with the present invention.

FIG. 11 illustrates, at 1100, an embodiment of an optionally substantially continuous type manufacturing method in accordance with the present invention. At 1102, elements including electrical elements such as traces, components, contact pads, etc. for (subassemblies of) a number of nodes may be provided on an optionally continuous or shared substrate 20 by applicable mounting and/or printing techniques, for instance. The substrate 20 may have been positioned on a moving belt, for example. At 1104, the material 30 of the first material layer is applied, optionally by curtain coating, onto the substrate and then shaped, at 1106, according to a desired target shape of the electrical node and related protective covering 10, optionally utilizing a roller or plate type mold 1107, e.g. a multi-cavity mold. At 1108, a number of processing tasks may be executed to a resulting assembly. For instance, in the case of multi-node assembly, it (or at least the shared substrate 20) may be cut into smaller pieces, each defining an electrical node.

Figure 12:
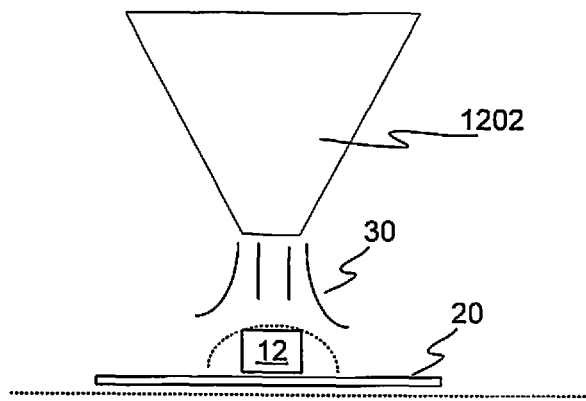
FIG. 12 illustrates a further embodiment of a manufacturing method in accordance with the present invention.

FIG. 12 illustrates, at 1200, a further embodiment of a manufacturing method in accordance with the present invention. Here the material 30 of the first material layer is provided in a flowable form e.g. via a dispensing nozzle 1202 onto the at least one electrical element, possible other element(s) and the substrate, whereupon the material is at least partially let to naturally establish its final shape defining the protective covering according to at least flow properties thereof.

Figure 13:
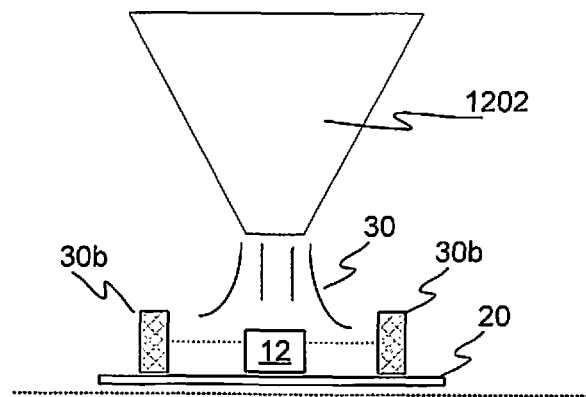
FIG. 13 illustrates still a further embodiment of a manufacturing method in accordance with the present invention.

FIG. 13 illustrates, at 1300, still a further embodiment of a manufacturing method in accordance with the present invention. Material of the first material layer is provided in a flowable form onto the at least one electrical element and the substrate, wherein the substrate has been pre-prepared with at least one, permanent or temporary, guiding structure 30b, optionally comprising a frame, to controllably limit material flow on the substrate and define the shape of the protective fill and covering.

Also in the embodiments of FIGS. 11-13, guided or assisted curing, e.g. by light, can be utilized depending on the characteristics of the material 30.

Figure 14:
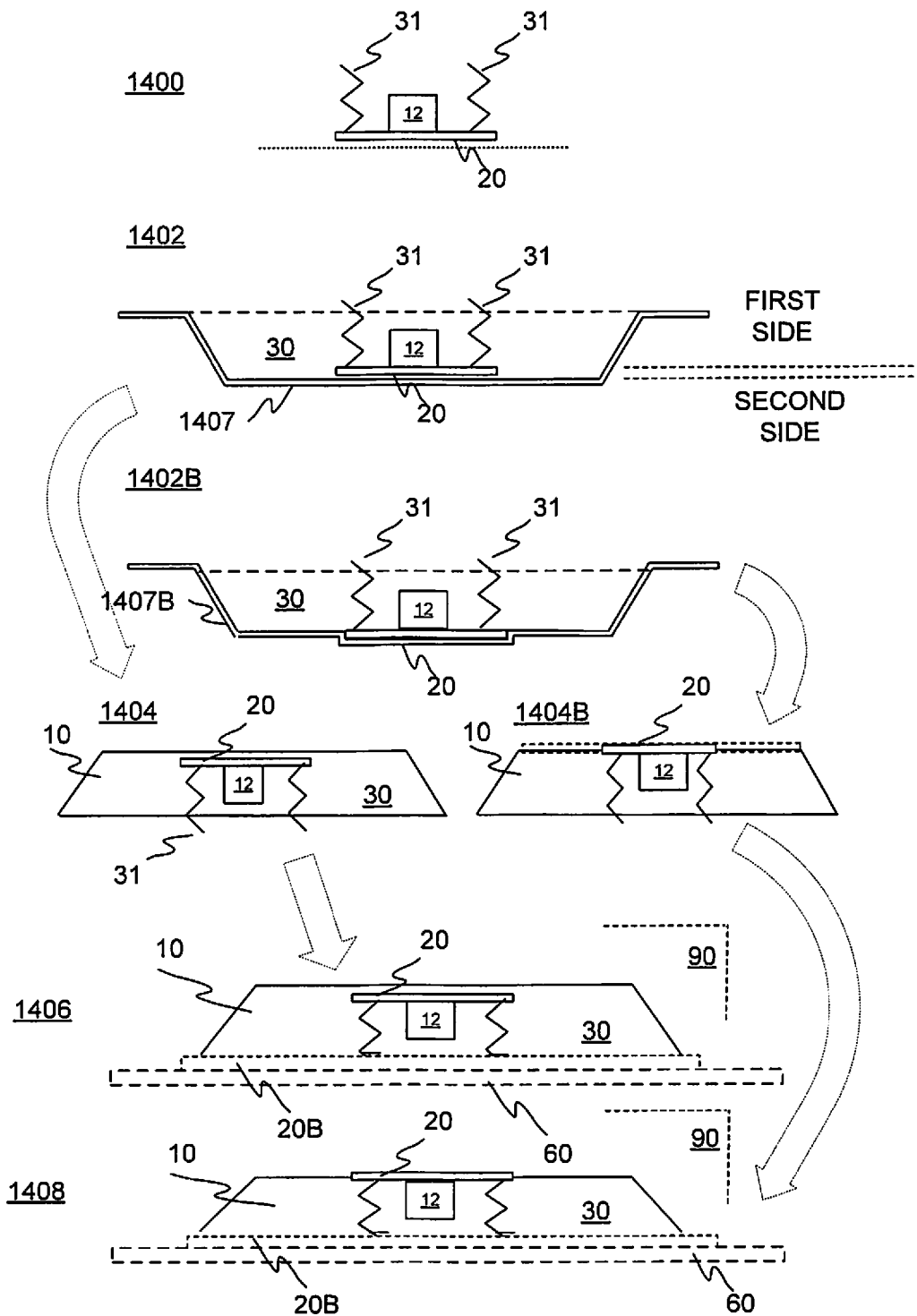
FIG. 14 illustrates additional embodiments of an electrical node and related potential manufacturing methods.

FIG. 14 illustrates additional embodiments of an electrical node and related applicable manufacturing methods. As apprehended by a person skilled in the art, different manufacturing methods presented herein may be mutually flexibly and selectively combined and/or supplemented with other solutions.

At 1400, a substrate 20 is shown with an electrical element 20 and (electrical) connecting elements, such as springs, other elastic elements or rods, 31 provided thereon.

At 1402 and 1402B, two different molds 1407, 1407B are shown, the latter comprising a feature such as a recess for accommodating at least portion of the substrate 20 so that when the material 30 is provided in the mold 1407B, it still at least partly embeds e.g. the electrical element 12 as in 1402 but not the substrate, not at least completely. The far-ends of the elements 31 may be left or processed free from the material 30 in both embodiments.

Accordingly, as shown at 1404 and 1404B, a corresponding node may be obtained (removed from the mold/mold removed and preferably flipped) that has the integrated element(s) such as the substrate 20 at least partially visible and/or not fully embedded in the material 30. Accordingly, the elements that have not been fully embedded, may establish at least portion of the exterior of the concerned node. This approach may facilitate obtaining nodes that benefit from having at least part of the substrate and/or one or more other elements such as electrical and/or thermal management elements non-embedded and interfacing, for example, the environment of the node. The benefits may relate to interaction such as measurements or communication relative to the environment, or e.g. thermal management such as cooling of integrated elements such as electronics in the node.

At 1406 and 1408, the nodes are provided on a larger host or specifically host surface or host substrate 60 of a host structure such as host device. The elements 31 may at this point connect the embedded circuit and related electrical elements 12 to an external circuit of the host structure or circuit reachable via the host structure. Element 20B refers to a substrate that may be optionally provided to the node 1404, 1404B to define, for example, contact surface thereof towards external structures such as the host substrate 60. The element 20B may be provided with one or more features such as through-holes or electrically conductive vias/wiring to enable electrical connection between the elements 31 and external structure such as circuit of the host substrate 60.

Figure 15:
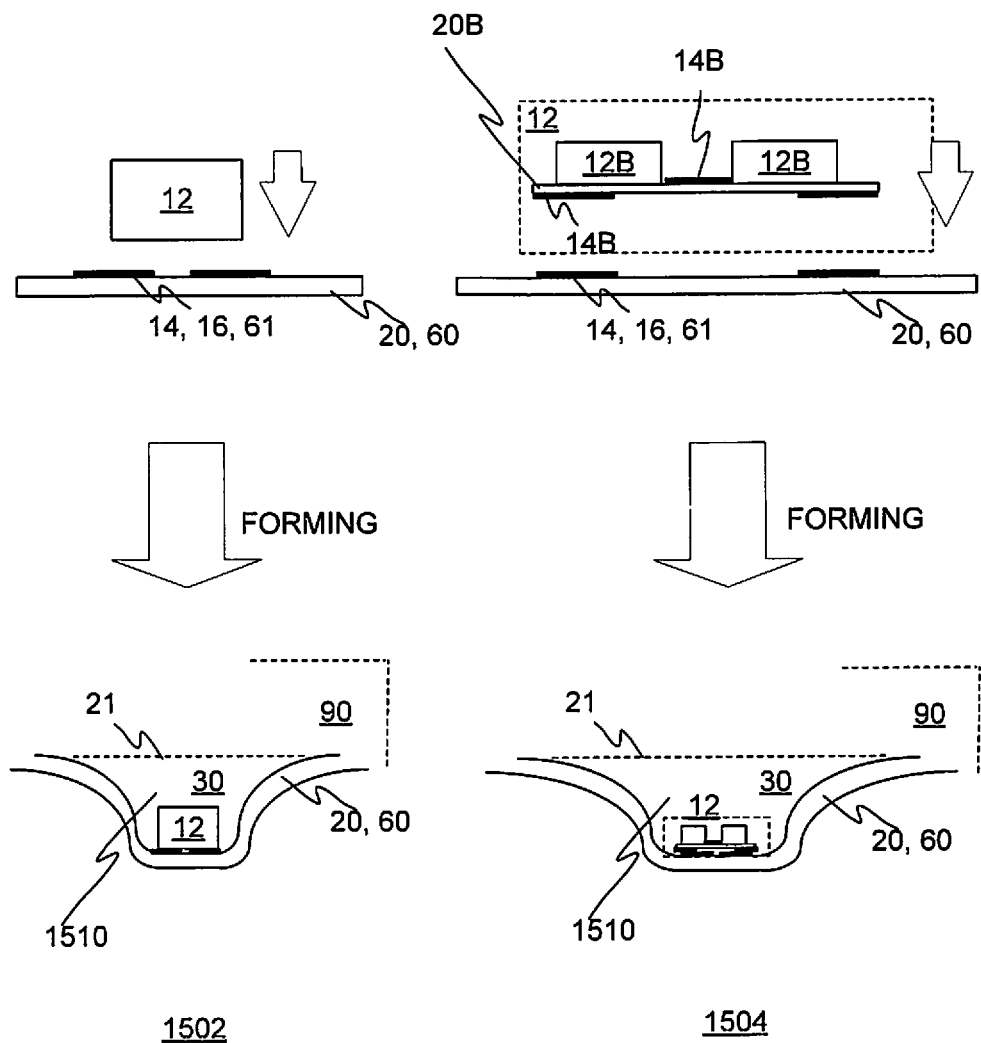
FIG. 15 illustrates potential provision of recesses or holes in a substrate for accommodating functional elements of the nodes.

In FIG. 15, it is generally but still merely exemplarily illustrated, as hereinbefore discussed that in some embodiments a substrate 20, 60 may contain or define a hole or recess 1510, which is configured to accommodate at least portion of one or more functional elements of or for a node 1502, 1504, such as electrical elements 12, 14. Yet, the accommodated elements may basically refer to any of e.g. afore-discussed connecting elements 16, 61 especially in the case of the substrate shown already being the (node) host 60 of a greater host structure. The first material layer 30 may have been provided onto the elements so that it further fills up at least portion of the remaining recess 1510.

When desired, an essentially flush surface may be obtained so that the recess-provided element(s) 12, 14, 16, 61 and optionally the material layer 30 define a substantially even surface with the areas defining the recess/hole (top) edges of the substrate 20, 60.

A common substrate such as host substrate 60 may be provided with several recesses so that each of them is associated with a separate node and thus accommodates related elements 12, 14, 16, 61 and e.g. fill material layer 30. Any of these several nodes at the respective locations of the recesses 1510 could be directly manufactured upon the common substrate such that they lack a dedicated substrate 20 of their own; in this and similar scenarios the nodes might thus have one or more already initially shared or common elements such as the substrate 60. Alternatively, any of the nodes could be at least partially pre-manufactured and only after then installed in their location on a common substrate such as host substrate 60 of a host structure either prior to or subsequent to formation of concerned recesses 1510.

The hole or recess 1510 may be produced in the substrate 20, 60 upfront, or as illustrated, subsequent to provision of at least some of the functional elements such as elements 12, 14 of the node 1502, 1504 thereto. 3D forming of the substrate is considered one feasible option for producing the recess 1510 whereas subtractive techniques to locally remove substrate material may be applicable as well e.g. in scenarios wherein the substrate is sufficiently thick and enables removal of material therefrom, or a through-hole is actually desired therein.

Embodiment 1502 shows functional elements such as electrical elements in the form of components 12 and traces 14 or e.g. connecting elements 16, 61 mounted or directly manufactured, e.g. printed, to the substrate 20, 60 at a location provided with, preferably by subsequent 3D forming such as thermoforming of, a recess 1510 so as to position the elements therein. Yet, fill material 30 has been provided to at least partially cover and embed the elements.

In the embodiment 1504 it is shown a pre-manufactured sub-assembly type of an element 12, with a (sub-)substrate 20B of its own (e.g. PCB or plastic film) and a number of features such as (electronic) components 12B and conductors 14B including e.g. traces and contact pads. Likewise, the sub-assembly type element 12 has been provided onto the substrate 20, 60 (optionally provided with a number of further electrical elements 12, 14 and preferably provided with suitable fastening or at least functional connection such as electrical connection providing features 16, 61 such as electrically conductive adhesive, non-conductive adhesive, solder, electrical contact pads, electromagnetic coupling features, or alike) in the recess 1510 established in the substrate 20, 60 preferably by 3D forming.

In some embodiments, e.g. a protective cap element 21 such as a (plastic) film may be optionally provided to at least partially cover the recess/hole 1510. The element 21 may have desired structural, material and/or other properties. For example, optically it 21 may locally or generally be opaque and/or transparent having regard to selected wavelengths. Electrically it 21 may be insulating or conductive either in desired places only or generally. The element 21 may be configured to define or host further features such as (printed) graphics and/or electrical features such as conductors or components. A material layer 90 such as molded or cast material layer may again be provided on top of the included node(s) notwithstanding the potential presence of element 21. Supplementary feature(s) such as an additional layer or particularly a film (see e.g. item 95 of FIG. 6) could be provided on layer 90, not explicitly shown in FIG. 15 in favor of clarity.

Thus, based on the foregoing it becomes clear to a skilled person that depending on the embodiment, the electrical node in accordance with the present invention may be connected to a host substrate either via the substrate hosting the embedded electrical elements (typically via the second side that is opposite to the first side provided with the elastic material layer) or via the elastic material layer itself and/or, for example, via an additional feature such as an additional substrate or other connecting facilitating feature provided onto the elastic layer.

A system comprising at least one electrical node as described herein (the included nodes may be mutually similar or different in terms of construction, materials, included elements and/or related functionalities or functional configuration/role) may be provided. In the system, the at least one node may be, optionally removably, attached to an external (host) device, material and/or structure (to host surface/substrate provided therein) which may have been provided with connecting feature(s) such as mechanical and/or electrical connecting elements for the node. The nodes of the system may be configured to communicate with each other and/or with other circuitry of the system or with a circuit that is at least reachable, e.g. communications-wise, via the system. Yet, a node may be powered or driven by the circuitry of the system.

For any external (host) device or structure, the at least one node may provide a desired functionality such as a sensing function, processing function, control function, power transfer function, data storage function, indication, communication and/or user interface (UI) function. The at least one node and e.g. at least one electrical element such as electronic component therein may be functionally such as electrically, electromagnetically, thermally or optically connected to an element such as electronic component of the external device or structure e.g. via one or more connecting elements including e.g. a number of conductive traces, pins, pads, connectors, wiring and/or cabling. Additional or alternative wireless (e.g. radio frequency) coupling is possible as well through implementing a selected wireless transfer technology and related elements (transmitter, receiver, transceiver). The at least one node and the element of the external device or structure may be configured to function cooperatively and thus establish a desired joint entity.

In some embodiments the multilayer structure may comprise a host substrate comprising formable such as thermoformable material that may be utilized or have been utilized to establish a desired three-dimensional shape through forming. The (formed) host substrate may be configured to accommodate the electrical nodes. Forming of the host substrate into a desired 3D-shape may take place prior to and/or subsequent to provision of features such as electrical nodes and/or other features thereon.

As deliberated hereinbefore, in various embodiments of the system or a multilayer structure as its one realization, e.g. molded or cast material layer comprising e.g. thermoplastic material may be provided on the host substrate, thus embedding at least portion of at least one of said one or more electrical nodes and/or other features such as further electrical elements (e.g. electronics including electronic component(s), for instance) provided thereon. The multilayer structure may indeed comprise a number of additional features such as electrical elements and/or thermal management elements provided to the host substrate and/or other layer of the structure and further optionally functionally, such as electrically and/or thermally, connected with at least one of said one or more electrical nodes to establish a desired connection for e.g. control, power, heat or data transfer purposes therebetween.

According to an embodiment, the electrical element 12 may comprise a processing unit, such as a microcontroller, signal processor or a processor. By arranging the processing unit into the node 100, access to the processing unit at least directly via its pins can be prevented. There can be arranged further components into the node through which the access is possible and which may include proprietary software and selected protocols for controlled access.

In various embodiments of the node, various signals emitted, received and/or processed by it (e.g. by the electrical element 12) may comprise at least one element selected from the group consisting of: electrical signal, electromagnetic signal, optical signal, current, voltage, power signal, digital signal, analogue signal, analogue electrical signal, digital electrical signal, control signal and (other) data signal.

According to one embodiment, the node or a related system/multilayer structure may be used in a security tag for clothing. Yet it may easily find use e.g. in connection with vehicles (e.g. in-vehicle electronics), lighting devices, wearable electronics, computing or communication devices, consumer electronics, measurement devices, and various other products.

In various embodiments, one or more, typically ready-made, components or elements including electronic components such as various SMDs may be attached or provided on film(s), PCBs or other substrate(s) e.g. by solder and/or adhesives. Alternatively or additionally, printed electronics technology may be applied to actually manufacture at least part of the components, such as OLEDs, directly onto the film(s) or other substrate(s).

Generally and as also discussed herein elsewhere, the electrical element 12 may be provided on a substrate utilizing any feasible positioning or installation technique such as standard pick and place method/equipment (when applicable). Applicable bonding (using e.g. adhesive or other bonding substance), gluing, and/or further securing techniques may be additionally utilized. Furthermore, the electrical element 12 may be printed, injection molded or dip molded.

In various embodiments, the electrical element 12 and/or other features of the node, of a hosting multilayer structure or of other type of a node-integrating system may comprise or define at least one element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component (detector), light-detecting or light-sensitive component (detector), photodiode, phototransistor, photovoltaic device, light source driver circuit, LED driver circuit, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical (MEMS) component, UI element, user input element, vibration element, sound producing element, communication element, transmitter, receiver, transceiver, antenna, resonator, infrared (IR) receiver or transmitter, wireless communication element, wireless tag, radio tag, tag reader, data processing element, data storage or memory element, electronic sub-assembly, light directing element, lightguide, lens and reflector. In case a sensor requiring functional connection with the environment is arranged e.g. within the node, the connection may be further provided thereto (e.g. fluidic, optical and/or electrical connection as also contemplated hereinbefore).

The node or the multilayer structure may thus incorporate electronics such as IC(s) and/or various components. At least part of the electronics of the multilayer structure 300 may be provided via an electrical node. Optionally, the node and/or one or more other elements such as electronic components or thermal management elements of the multilayer structure may be at least partially overmolded by a protective plastic layer as discussed hereinbefore. For example, adhesive, pressure, mechanical fixing features, and/or heat may be used for mechanical bonding of the node with a substrate, for instance. Solder, wiring and conductive ink are examples of applicable options for providing electrical connections between the elements of the nodes and/or the hosting multilayer structure, and with the remaining electrical elements, such as electronic components, in the structure 300. The hosting multilayer structure may in turn be operatively connected to an external system either wirelessly (e.g. electromagnetically) or wired (e.g. electrical wiring, cabling, etc.)

Regarding the resulting overall thickness of the obtained electrical node, related assembly such as a strip or sheet, and/or the multilayer structure, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimetres, but considerably thicker or thinner embodiments are also feasible.

Further layers may be added, especially, to the multilayer structure by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate. A connector element for implementing e.g. electrical connection may be provided to the node (e.g. interface or connector type of a node) or structure and connected to a desired external connecting element such as external connector and/or connector cable of an external device, system or structure. For example, these two connectors may together form a plug-and-socket type connection.

In various additional or supplementary embodiments, e.g. any substrate 20, 60, optionally of a film type, may comprise or consist of material(s) such as plastics, e.g. thermoplastic polymer, and/or organic or biomaterials with reference to e.g. wood, leather or fabric, or a combination of any of these materials with each other or with plastics or polymers or metals. The substrate may comprise or consist of thermoplastic material. The substrate may be essentially flexible or bendable. In some embodiments, the substrate may alternatively be substantially rigid. The thickness of the film may vary depending on the embodiment; it may only be of few tens or hundreds of a millimeter, or considerably thicker, in the magnitude of one or few millimeter(s), for example.

The substrate may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

As also mentioned hereinbefore, in various embodiments material(s) of the substrate and/or of further layer(s) may at least partially be optically substantially opaque or at least translucent having regard to predefined wavelengths e.g. in visible spectrum. This is also applicable to the molded or cast material layer 90. The concerned element such as a film type substrate, coating or other layer, optionally defining at least portion of the exterior (surface) of the node or multilayer structure, or being at least visible or otherwise perceivable therethrough, may have been provided with a number of visually distinguishable, decorative/aesthetic and/or informative, features such as graphical pattern and/or color thereon or therein. The features may have been provided on the same side of the substrate with the electrical element 12 so that they have been also at least partially sealed, or on the opposite side and thus may or may not be sealed by the plastic material(s) through the associated overmolding procedure of the electrical node, for instance. Accordingly, IML (in-mold labeling)/IMD (in-mold decoration) technique is applicable. The used materials may be at least partially, i.e. at least in places, optically substantially transparent to radiation such as visible light emitted by the electronics thereon. The transmittance may be about 80%, 85%, 90%, 95% or higher, for example.

The molded or cast material(s) may comprise thermoplastic and/or thermosetting material(s). Thickness of the molded or otherwise produced layer(s) may vary depending on the embodiment. It may be, for example, in the order of magnitude of less than one, one, few or tens of millimeters. The material(s) may be e.g. electrically insulating.

In more detail, an included layer such as layer 90 may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various additional or supplementary embodiments, a number of elements 12, conductors 14 and/or connection/contact elements 16, such as pads, comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, selected features including also e.g. graphics, coloring or other visual features may be provided on internal surfaces or layers of the nodes. Accordingly, different impacts, rubbing, chemicals, etc. that could easily damage e.g. painted, printed or mounted surface features do not affect or reach the embedded/non-surface features. Relating covering layers such as film(s) or the elastic (fill) material(s) may be manufactured or processed, optionally cut, carved, etched or drilled into a desired shape with necessary characteristics such as holes or notches for exposing the underlying features such as material layers or e.g. electrical elements to a selected extent to the environment.

The scope of the present invention is determined by the attached claims together with the equivalents thereof. A person skilled in the art will appreciate the fact that the dis-closed embodiments were constructed for illustrative purposes only, and other arrangements applying many of the above principles could be readily prepared to best suit each potential use scenario. For instance, instead of or in addition to molding or casting material layers, a layer could be prepared upfront and then attached to a substrate (e.g. host substrate 60) by suitable lamination technique applying e.g. adhesive, mechanical attachment means (screws, bolts, nails, etc.), pressure and/or heat. Finally, in some scenarios, instead of molding or casting, the plastic or other layer could be produced on the target substrate(s) using a suitable deposition or a further alternative method. Instead of or in addition to embedded electrical or specifically electronic elements such as conductors or electronic components, functional nodes could be constructed as discussed herein without embedded strictly electrical features but having e.g. essentially or purely chemical or mechanical function or nature. Yet, such nodes could still be included in IMSE structures, for instance.

The invention claimed is:

1. A multilayer structure comprising:
   at least one electrical node including:
   a substrate for accommodating at least one functional element, said substrate having a first side and an opposite second side, said substrate further hosting a number of connecting elements for at least one electrically or electromagnetically connecting the at least one functional element with an external structure;
   the at least one functional element comprising at least one electronic component and a number of conductive traces connecting thereto, provided to the substrate and projecting from the first side of the substrate; and
   a first material layer having a modulus of elasticity of about 2000 MPA or less and defining a protective covering at least upon said at least one functional element, the first side of the substrate, and opposing first and second lateral sides of the substrate, said first material layer defining at least a portion of the exterior surface of the node;
   wherein the first material layer is arranged to reduce at least one of thermal expansion or mechanical deformation related stresses between one or more elements included in the node, adjacent the node or at least at a proximity thereto, between the connecting elements and at least one element of the external structure; and the external structure including:
   a host substrate supporting the at least one electrical node thereon by abutting the second side of the substrate of the electrical node; and
   a plastic material layer molded or casted, from a source material, directly on the host substrate and the at least one electrical node, thereby at least partially embedding the at least one electrical node therein, the at least one electrical node further including a second substrate on a side of the first material layer that is opposite to a side facing towards the substrate and at least one functional element thereon, wherein the second substrate is configured for attaching the at least one electrical node to the host substrate.

2. The multilayer structure of claim 1, wherein the at least one functional element comprises an essentially electrical element.

3. The multilayer structure of claim 1, wherein the substrate defines a recess or hole accommodating at least a portion of the at least one functional element.

4. The multilayer structure of claim 1, wherein the first material layer is adherent to a flowing and thereafter solidified plastic material to be provided in contact with the first material layer and includes at least one of: thermoplastic material, polymeric or alike material, lignin or alike material, TPU, polymer, elastomeric material, PC, PMMA, ABS, PET, PA, GPPS, PCPA (pentachlorophenyl acrylate), cellulose based thermoplastic material, or MS resin.

5. The multilayer structure of claim 1, wherein the first material layer is adherent to at least one of a material of the substrate or of said at least one functional element and includes at least one of: polymer, conductive polymer, thermoplastic material, organic material, elastomeric material, electrically insulating material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), metal, wood, solid wood, veneer, plywood, bark, tree bark, birch bark, cork, leather, textile or fabric, natural leather, natural textile or fabric material, textile material, cotton, wool, linen, silk, formable material, thermoformable material, cold-formable material, gold, copper, tin, silver, palladium, solder resist, thermally curable solder resist, UV curable solder resist, epoxy, lignin or alike material, multi-component epoxy, ink, or conductive ink.

6. The multilayer structure of claim 1, wherein the first material layer comprises material associated with a coefficient of thermal expansion falling in a range between about 1 and 300 ppm/K.

7. The multilayer structure of claim 1, wherein the first material layer comprises at least one of composite material or a filler in a host material, the first material layer comprising mutually different constitutions of material, organized in sub-layers, having functional properties including at least one of refractive indexes or other optical characteristics to establish a selected optical functionality.

8. The multilayer structure of claim 1, wherein the first material layer comprises thermally conductive material.

9. The multilayer structure of claim 1, wherein the first material layer comprises material provided in the form of a filler and includes at least one of: optically, having regard to selected wavelengths including visible light, essentially at least one of transparent or colorless material that is substantially chemically inert to discoloration when exposed to at least one of heat or high-energy photons, electrically insulating material, electrically conductive material, or luminescent material.

10. The multilayer structure of claim 1, wherein the substrate includes at least one of: planar piece of substrate material, printed circuit board, rigid printed circuit board, flexible printed circuit board, FR4 based circuit board, ceramic electrical substrate, multilayer circuit board, 3D-formed substrate, multilayer substrate, film substrate, flexible film substrate, 3D-formed substrate, additively manufactured single or multilayer circuit board, additively manufactured circuit board comprising both electrically insulating and conductive material, thermoformed substrate, thermoformable substrate, thermoplastic substrate, polymer substrate, printed film substrate, or patterned conductive polymer substrate.

11. The multilayer structure of claim 1, further comprising a thermal management element.

12. The multilayer structure of claim 1, wherein the first material layer has a shape selected from the group consisting of a: rectangle, trapezoid, frustum, isosceles trapezoid, isosceles trapezoid with shorter base facing the substrate film, isosceles trapezoid with longer base facing the substrate film, rounded shape, rounded rectangle, rounded isosceles trapezoid, triangle, rounded triangle, semicircle, dome, convex, bell-shape, mushroom-shape, conical, semi-ellipse, and droplet, and column shape.

13. The multilayer structure of claim 1, wherein the at least one functional element includes at least one of: electronic component, active component, passive component, integrated circuit, electromechanical component, electrical conductor, printed electrical conductor, printed electronics—produced electrical conductor, electrode, contact pad, conductor trace, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, microelectromechanical (MEMS) component, UI element, user input element, vibration element, sound producing element, communication element, transmitter, receiver, transceiver, antenna, resonator, wireless communication element, wireless tag, radio tag, tag reader, data processing element, data storage or memory element, or electronic sub-assembly.

14. The multilayer structure of claim 1, wherein the host substrate accommodates said electrical node, the material layer, and a number of further elements, including at least one of thermal management elements, conductors, optical elements, or electronic components, thereon, wherein the first side or the opposite, second side of the substrate of the electrical node faces towards the host substrate.

15. The multilayer structure of claim 3, wherein the recess or hole of the substrate further accommodates at least a portion of the first material layer.

16. The multilayer structure of claim 6, wherein the first material layer comprises a material associated with a coefficient of thermal expansion falling in a range between about 10 and 120 ppm/K.

17. The multilayer structure of claim 11, wherein the thermal management element comprises at least one of a cooling element or heating element, the cooling element or the heating element being at least one of: a heat sink, a thermal slug, or a thermal well.

18. A method for manufacturing an electrically functional structure comprising an integrated electrical node, the method comprising:
  obtaining a substrate hosting at least one, printed functional element, mounted functional element, electrical element, electronic element, electromechanical element or electro-optical element, said substrate having a first side and an opposite second side, and provided therewith a number of connecting elements, including at least one of contact pads, springs, pins, other wired or wireless elements, for at least one of electrically or electromagnetically connecting the at least one functional element with a circuit of an external structure; and
  providing a solidifiable first material layer in a pre-solidified state upon the at least one functional element, and further upon opposing first and second lateral sides of the substrate and at least a portion of the first side of the substrate surrounding the at least one functional element to establish the integrated electrical node comprising the substrate, said at least one functional element and said first material layer that subsequent to solidification, comprising at least one of thermal or pressure curing, defines a protective covering;
  attaching the electrical node to a host substrate; and
  producing a plastic material layer directly upon the electrical node and the host substrate by casting or molding, thereby at least partially embedding the electrical node therein;
  wherein the first material layer, in a solidified state, comprises elastic material having a modulus of elasticity of about 2000 MPA or less and is arranged to reduce mechanical deformation related stresses between one or more elements included in the node, adjacent the node or at least at a proximity thereto, between the connecting elements and at least one element of the external structure; and
  wherein a second substrate is provided to a side of the first material layer that is substantially opposite to a side facing towards the substrate, wherein the second substrate is configured for attaching the electrical node to the host substrate.

19. The method of claim 18, wherein a film-like or receptacle type mold, being reusable or disposable, is utilized to accommodate and shape the material of the first material layer during solidification, wherein the mold includes at least one of: metal, plastic, ceramic, wood, fabric, cellulose, lignin, or sacrificial material.

20. The method of claim 18, wherein material of the first material layer is applied, by curtain coating, onto the substrate and then shaped according to a selected target shape of the electrical node and related protective covering, utilizing at least one of a roller type mold or plate type mold.

21. The method of claim 18, wherein material of the first material layer is provided in a flowable form onto the at least one functional element and the substrate, whereupon the material is at least partially let to at least one of naturally or guidedly establish its final shape defining the protective covering according to at least flow properties thereof.

22. The method of claim 18, comprising at least partial provision of material of the first material layer in a flowable form onto the at least one functional element and the substrate, wherein the substrate has been pre-prepared with at least one, permanent or temporary, guiding structure, comprising a frame, to controllably limit material flow on the substrate and define the shape of the protective covering.

\* \* \* \* \*